United States Patent
Kim et al.

(10) Patent No.: US 10,083,915 B2
(45) Date of Patent: Sep. 25, 2018

(54) SEMICONDUCTOR DEVICE

(71) Applicant: Samsung Electronics Co., Ltd., Suwon-si, Gyeonggi-do (KR)

(72) Inventors: Ki-hyuk Kim, Seoul (KR); Sang-hyun Lee, Suwon-si (KR); Sung-jin Kim, Seoul (KR); Yong-cheol Seo, Suwon-si (KR); Jin-kuk Bae, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/609,183

(22) Filed: May 31, 2017

(65) Prior Publication Data

US 2017/0345768 A1    Nov. 30, 2017

(30) Foreign Application Priority Data

May 31, 2016  (KR) .................. 10-2016-0067743

(51) Int. Cl.
| | |
|---|---|
| *H01L 21/78* | (2006.01) |
| *H01L 23/544* | (2006.01) |
| *H01L 23/31* | (2006.01) |
| *H01L 23/00* | (2006.01) |
| *H01L 21/784* | (2006.01) |
| *H01L 21/768* | (2006.01) |
| *H01L 21/822* | (2006.01) |

(52) U.S. Cl.
CPC ............ *H01L 23/544* (2013.01); *H01L 21/78* (2013.01); *H01L 23/3171* (2013.01); *H01L 24/06* (2013.01); *H01L 24/14* (2013.01); *H01L 21/76874* (2013.01); *H01L 21/784* (2013.01); *H01L 21/822* (2013.01); *H01L 2223/5446* (2013.01)

(58) Field of Classification Search
CPC ..... H01L 21/78; H01L 21/784; H01L 21/822; H01L 21/76874
USPC .......................................... 257/773
See application file for complete search history.

(56) References Cited

U.S. PATENT DOCUMENTS

| | | | | |
|---|---|---|---|---|
| 5,141,623 A | * | 8/1992 | Cohen ................. | G11B 5/3163 204/192.34 |
| 7,436,047 B2 | | 10/2008 | Yang | |
| 7,518,217 B2 | | 4/2009 | Fujita et al. | |

(Continued)

FOREIGN PATENT DOCUMENTS

| | | |
|---|---|---|
| JP | 2013-143514 A | 7/2013 |
| JP | 5647328 B2 | 12/2014 |
| KR | 10-0694420 B1 | 3/2007 |

*Primary Examiner* — George Fourson, III
(74) *Attorney, Agent, or Firm* — Harness, Dickey & Pierce, P.L.C.

(57) ABSTRACT

A semiconductor device includes a semiconductor substrate including a main chip region and a remaining scribe lane region surrounding the main chip region, a passivation layer on the main chip region, the passivation layer including a plurality of bridge patterns extending from the main chip region in a first direction across the remaining scribe lane region, a plurality of bump pads exposed by the passivation layer on the main chip region, a plurality of dam structures along edges of the main chip region on the remaining scribe lane region, the plurality of bridge patterns arranged on the plurality of dam structures at a first pitch in the first direction, a seed layer on the plurality of bump pads, and bumps on the seed layer.

19 Claims, 23 Drawing Sheets

(56) References Cited

U.S. PATENT DOCUMENTS

| | | | |
|---|---|---|---|
| 8,441,123 B1 * | 5/2013 | Lee | H01L 21/563 |
| | | | 257/737 |
| 8,836,084 B2 | 9/2014 | Chen et al. | |
| 9,105,706 B2 | 8/2015 | Otsuka | |
| 2009/0081566 A1 | 3/2009 | Yang | |
| 2009/0298234 A1 * | 12/2009 | Lee | B28D 5/00 |
| | | | 438/114 |
| 2015/0194390 A1 | 7/2015 | Huang et al. | |
| 2015/0371957 A1 | 12/2015 | Wang et al. | |

\* cited by examiner

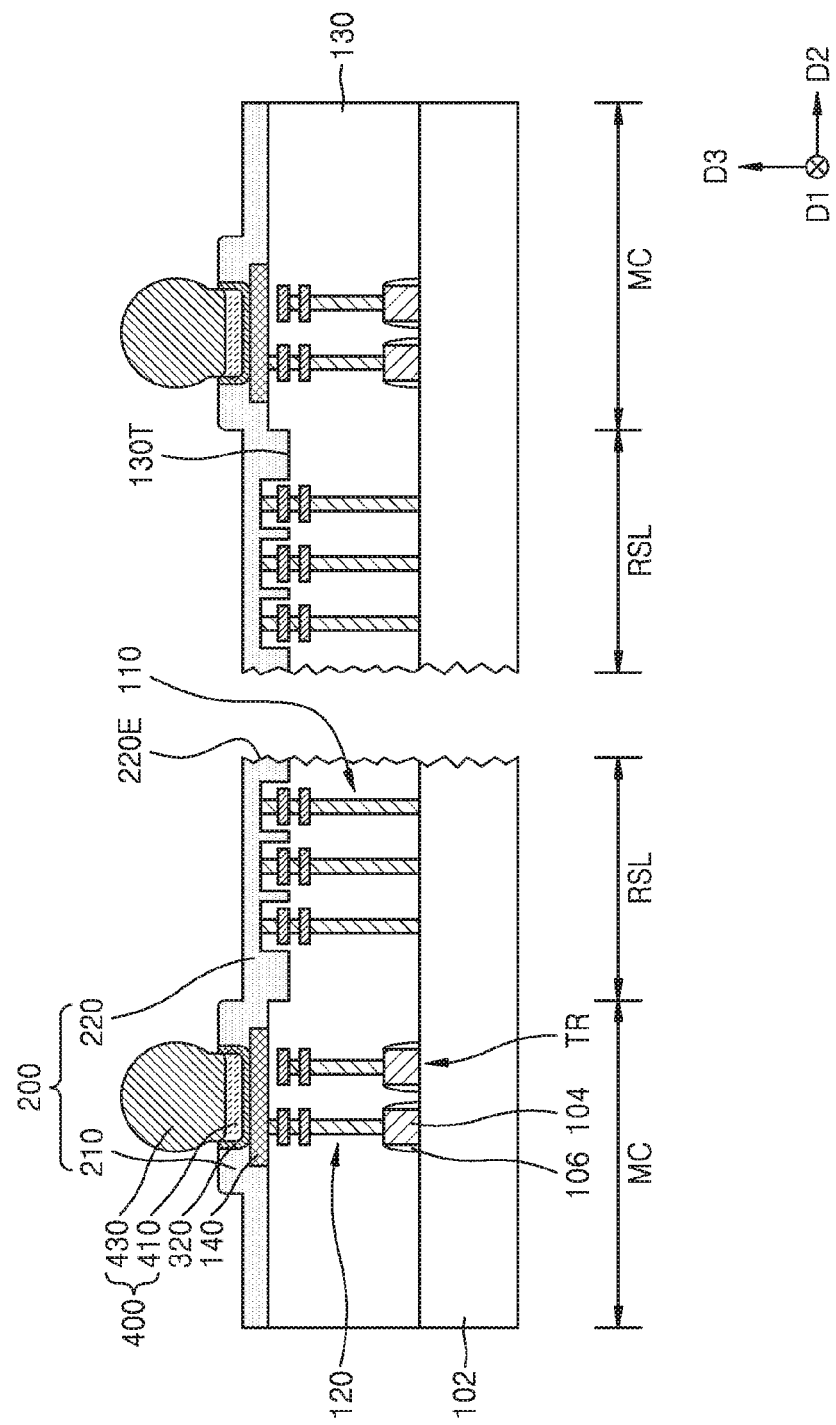

SEMICONDUCTOR DEVICE

CROSS-REFERENCE TO RELATED APPLICATION

This application claims the benefit of Korean Patent Application No. 10-2016-0067743, filed on May 31, 2016, in the Korean Intellectual Property Office, the disclosure of which is incorporated herein in its entirety by reference.

BACKGROUND

1. Field

Some example embodiments of the inventive concepts relate to a semiconductor device, and more particularly, to a semiconductor device including a plurality of bridge patterns such that bumps on semiconductor devices of a semiconductor substrate have a uniform height.

2. Description of the Related Art

Generally, a semiconductor device is fabricated via a die sawing operation for dicing a semiconductor substrate having integrated circuit devices formed thereon. During the die sawing operation, a sawing blade dices a semiconductor substrate along a scribe lane region, and thus, a plurality of semiconductor devices are physically separate from one another. As integrated circuit devices have higher capacity and higher integration, a portion of a semiconductor substrate corresponding to a scribe lane region is reduced. Thus, due to stress applied to semiconductor devices during a die sawing operation, integrated circuit devices are more likely to be damaged during the die sawing operation.

SUMMARY

Some example embodiments of the inventive concepts provide a semiconductor device having bumps with a uniform height.

Other example embodiments of the inventive concepts also provide a method of fabricating semiconductor device with bumps having a uniform height.

According to an example embodiment of the inventive concepts, a semiconductor device includes a semiconductor substrate including a main chip region and a remaining scribe lane region surrounding the main chip region, a passivation layer on the main chip region, the passivation layer including a plurality of bridge patterns extending from the main chip region in a first direction across the remaining scribe lane region, a plurality of bump pads exposed by the passivation layer on the main chip region, a plurality of dam structures along edges of the main chip region on the remaining scribe lane region, the plurality of bridge patterns arranged on the plurality of dam structures at a first pitch in the first direction, a seed layer on the plurality of bump pads, and bumps on the seed layer.

According to another example embodiment of the inventive concepts, a semiconductor device includes a semiconductor substrate including a plurality of main chip regions and a scribe lane region surrounding the main chip regions, the scribe lane region including a first region and a second region different from the first region, a plurality of dam structures at edges of the main chip regions on the scribe lane region, a passivation layer on the main chip regions, the passivation layer including a plurality of bridge patterns on the plurality of dam structures, the plurality of bridge patterns covering the first region of the scribe lane region such that the second region of the scribe lane region is exposed, a plurality of bump pads exposed by the passivation layer on the main chip regions, a seed layer on the plurality of bump pads, and bumps on the seed layer.

According to another example embodiment of the inventive concepts, a semiconductor device includes a semiconductor substrate including a plurality of main chip regions and a scribe lane region surrounding the main chip regions, a plurality of conductive structures on the scribe lane region adjacent edges of the main chip regions, and a plurality of bridge patterns extending across portions of the plurality of conductive structures to connect the main chip regions and the scribe lane region.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

Figure 1:
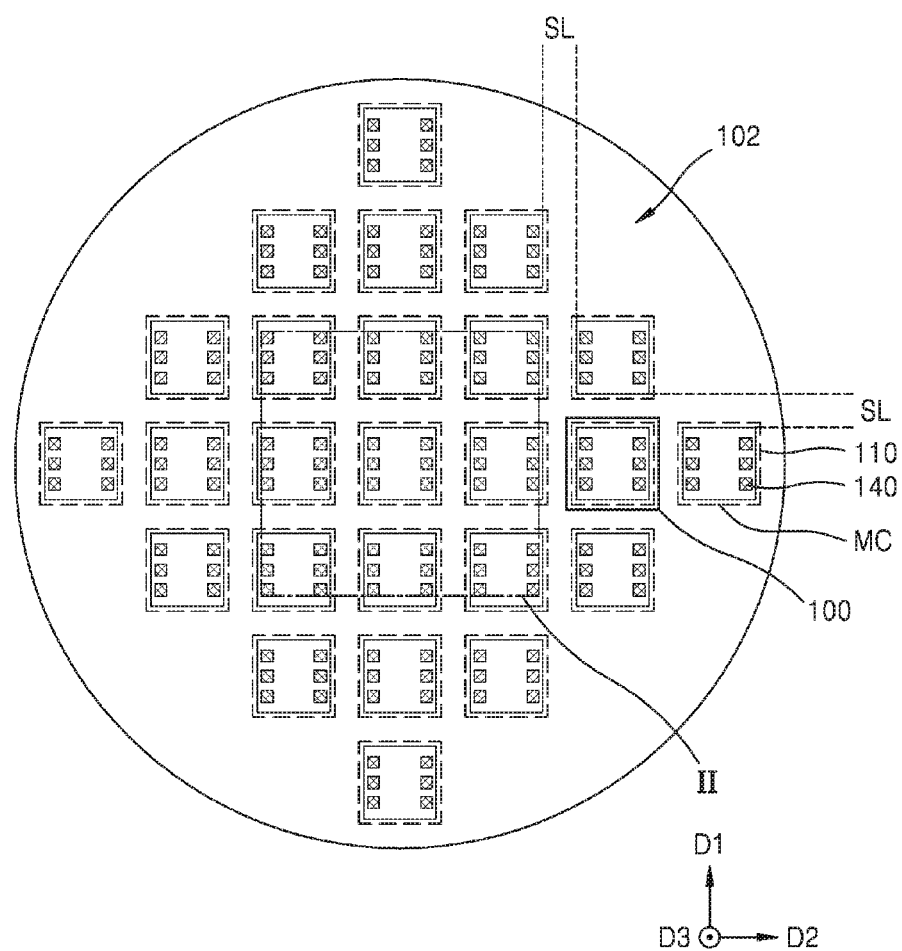
FIG. 1 is a schematic plan view of a semiconductor substrate including a semiconductor device according to an example embodiment.

FIG. 1 is a schematic plan view of a semiconductor substrate including a plurality of semiconductor devices according to an example embodiment.

Referring to FIG. 1, a semiconductor substrate 102 includes main chip regions MC and remaining scribe lane regions SL defined between the main chip regions MC.

Each of a plurality of semiconductor devices 100 in the semiconductor substrate 102 may include a main chip region MC and a scribe lane region SL (refer to FIG. 4) around the main chip region MC. For convenience of explanation, only some components constituting the semiconductor device 100 are shown.

The semiconductor substrate 102 may be a wafer. The semiconductor substrate 102 may include a semiconductor material; e.g., silicon (Si). Alternatively, the semiconductor substrate 102 may include a semiconductor atom, such as germanium (Ge), or a compound semiconductor material; such as silicon carbide (SiC), gallium arsenide (GaAs), indium arsenide (InAs), and indium phosphide (InP). According to some example embodiments, the semiconductor substrate 102 may have a silicon-on-insulator (SOI) structure. The semiconductor substrate 102 may include a conductive region; e.g., a well doped with an impurity, a structure doped with an impurity, etc. The semiconductor substrate 102 includes a top surface having formed thereon the plurality of semiconductor devices 100 and a bottom surface. The bottom surface may be a polished surface on which a polishing operation is performed in order to reduce thickness of the semiconductor substrate 102. The polished operation may include a grinding operation.

The plurality of semiconductor devices 100 may be 2-dimensionally arranged on the semiconductor substrate 102. The semiconductor device 100 may include a memory device, a logic device, etc. A plurality of bump pads 140 may be arranged on the top surface of each of the plurality of semiconductor devices 100.

The scribe lane region SL may extend in a first direction D1 and a second direction D2 that is perpendicular to the first direction D1. The scribe lane region SL may have a straight lane-like shape having a constant width. In other words, the plurality of semiconductor devices 100 may be surrounded by the remaining scribe lane regions SL to be apart from one another. Generally, the plurality of semiconductor devices 100 may be separated into semiconductor chips by performing a die-sawing operation along the remaining scribe lane regions SL.

As the semiconductor substrate 102 and various types of material layers formed on the semiconductor substrate 102 are diced in the die-sawing operation, the semiconductor substrate 102 may be physically separated into the plurality of semiconductor devices 100.

Recently, as an integrated circuit device is required to have ever larger capacity and higher integration, an area of a semiconductor substrate occupied by a scribe lane region SL is reduced, and thus, an integrated circuit device is more likely to be damaged due to stress applied to semiconductor devices during a die sawing operation. Therefore, the semiconductor device 100 is fabricated to reduce or prevent defect of integrated circuit devices by forming a plurality of dam structures 110 at a portion of the scribe lane region SL in order to reduce or prevent the occurrence and spreading of a crack that may be formed during a die sawing operation for dicing the semiconductor substrate 102.

In the semiconductor device 100, as the plurality of dam structures 110 are formed, trenches having a large aspect ratio are formed between the plurality of dam structures 110. When a seed layer is formed in order to form bumps on the bump pads 140, the seed layer may not be uniformly deposited along the sidewalls of the trenches, and thus, an opening defect or increased resistance of the seed layer may occur.

Therefore, in the semiconductor devices 100 according to an example embodiment, a plurality of bridge patterns (not shown) extending across the top surfaces of the plurality of dam structures 110 are formed in the scribe lane region SL in order to reduce indentations due to the trenches. Therefore, since the seed layer may be formed partially uniform while the plurality of dam structures 110 are formed, an increase of a resistance of the seed layer may be reduced or prevented during an electroplating operation for forming bumps, and thus, a distribution of heights of bumps formed on the bump pads 140 may be reduced. A detailed description thereof will be given below.

Figure 2:
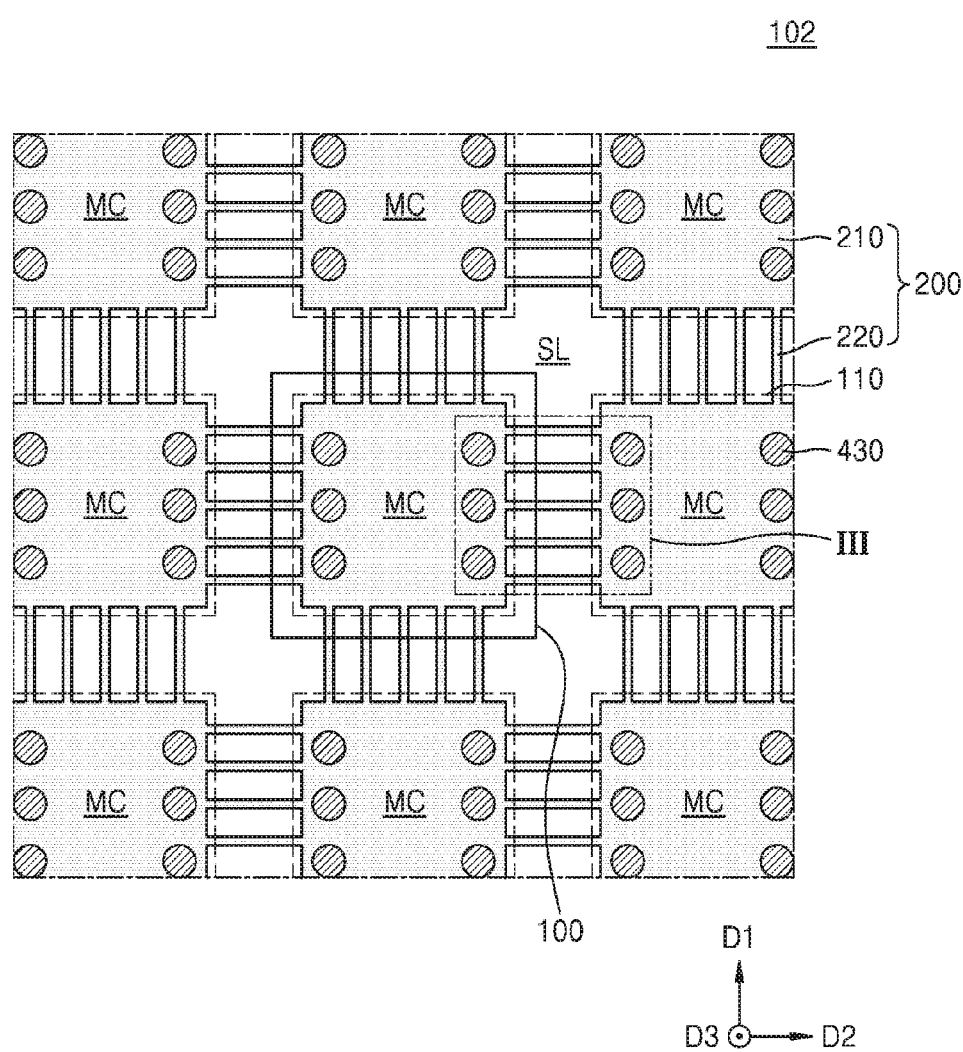
FIG. 2 is an enlarged plan view of portion II of FIG. 1, showing a plurality of semiconductor devices.

FIG. 2 is an enlarged plan view of portion II of FIG. 1, showing the plurality of semiconductor devices 100.

Referring to FIG. 2, a relative positional relationship between the plurality of dam structures 110, a passivation layer 200, and a plurality of bumps 400 constituting each of the plurality of semiconductor devices 100 is shown.

The semiconductor substrate 102 may include a plurality of main chip regions MC, where main chip regions MC adjacent to each other may be separated from one another by the remaining scribe lane regions SL. An integrated circuit device may be formed in the main chip region MC. The integrated circuit device may include a memory device or a logic device. Furthermore, the integrated circuit device may include a plurality of independent devices of various types. The plurality of independent devices may include various fine electronic devices, e.g., MOSFETs like CMOS transistors, system large scale integrations (LSI), image sensors like CMOIS imaging sensors (CIS), MEMS, active devices and/or passive devices.

The plurality of dam structures 110 may be formed in the scribe lane region SL adjacent to the semiconductor device 100 to surround edges of the semiconductor device 100. The plurality of dam structures 110 may extend from the top surface of the semiconductor substrate 102 in a third direction D3 perpendicular to the first direction D1 and the second direction D2. Furthermore, the plurality of dam structures 110 may discontinuously surround edges of the main chip region MC. In other words, the plurality of dam structures 110 may be formed to be a constant interval or different intervals apart from each other. The plurality of dam structures 110 may include a conductive material.

The passivation layer 200 may include a main chip protecting layer 210 that covers the main chip region MC and a plurality of bridge patterns 220 that extend across portions of the plurality of dam structures 110 at a first pitch in the first direction. The plurality of bridge patterns 220 are in the form of bridges adjacent to one another and connecting the main chip protecting layer 210 to the scribe lane region SL. The passivation layer 200 may include one of various materials. For example, the passivation layer 200 may include photo-sensitive polyimide (PSPI).

A portion of the scribe lane region SL where the plurality of bridge patterns 220 is not formed is a portion where the passivation layer 200 is opened. The plurality of bridge patterns 220 may be formed on all edges of each of the main chip regions MC. In this case, numbers of the plurality of bridge patterns 220 formed at respective edges of the main chip region MC may be equal to one another. Alternatively, according to another example embodiment, the plurality of bridge patterns 220 may be formed only on portions of edges of the main chip region MC, and in this case, numbers of the plurality of bridge patterns 220 formed at respective edges of the main chip region MC may be different from one another. Although FIG. 2 shows that the five bridge patterns 220 are formed on each edge of the main chip region MC, the number of the plurality of bridge patterns 220 is not limited thereto.

The plurality of bumps 400 may be formed on a bump pad (not shown) exposed on the main chip region MC by the passivation layer 200. Each of the plurality of bumps 400 may have a double-layer structure including a pillar layer and a solder layer. The pillar layer may include copper. The solder layer may include an alloy of tin (Sn) and silver (Ag), where an additive including copper (Cu), palladium (Pd), bismuth (Bi), and antimony (Sb) may be added if necessary. The plurality of bumps 400 may be formed in an electroplating operation. Although FIG. 2 shows that the plurality of bumps 400 are arranged in a line at some of edges of the main chip region MC, the inventive concepts are not limited thereto, and the plurality of bumps 400 may also be formed at the center of the bump 400. Furthermore, although dozens of or hundreds of the bumps 400 may be disposed in the main chip region MC, only the six bumps 400 are shown for convenience of explanation.

Figure 3:
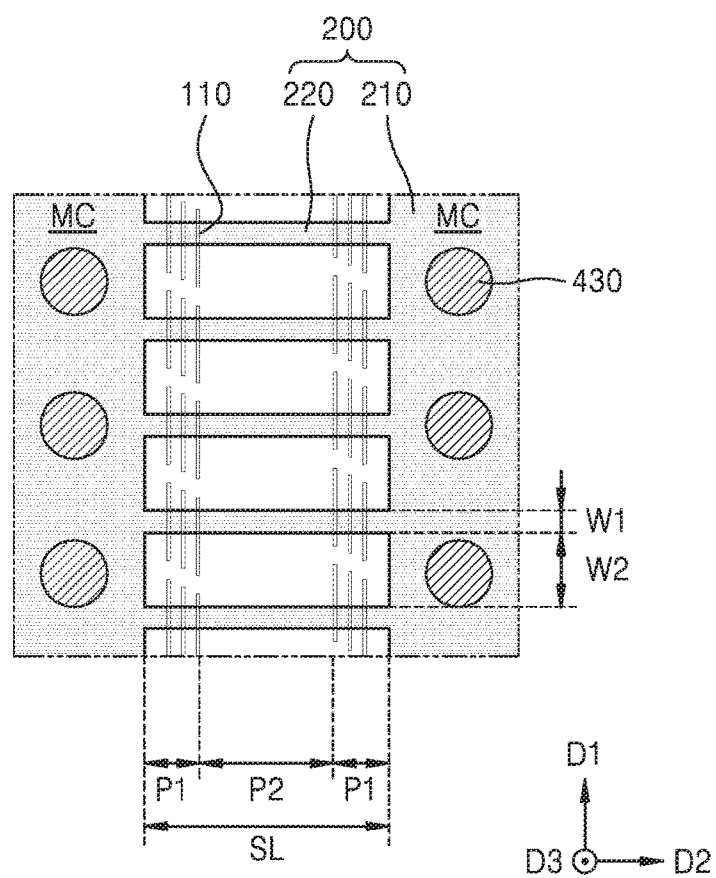
FIG. 3 is an enlarged plan view of portion III of FIG. 2, showing a portion of a semiconductor device.

FIG. 3 is an enlarged plan view of portion III of FIG. 2, showing a portion of the semiconductor device 100.

FIG. 3 shows a relative positional relationship between the plurality of dam structures 110, the passivation layer 200, and the plurality of bumps 400 in the scribe lane region SL.

The scribe lane region SL may include a first region P1 that surrounds edges of the main chip region MC at locations nearby the main chip region MC and a second region P2 that surrounds the first region P1. In other words, the second region P2 may be separated from each other main chip region MC by the first region P1. Here, the first region P1 may be a region not diced by a sawing blade during a die sawing operation, whereas the second region P2 may include a portion diced by the sawing blade during the die sawing operation. In other words, the sawing blade may dice the semiconductor substrate 102 (refer to FIG. 2) along the second region P2.

As the semiconductor substrate 102 and various material layers formed on the semiconductor substrate 102 are diced in the die sawing operation, the semiconductor substrate 102 and the various material layers may be physically separated into the plurality of semiconductor devices 100 (refer to FIG. 2).

The plurality of dam structures 110 may be arranged on a portion of the semiconductor substrate in the first region P1 of the scribe lane region SL. The plurality of dam structures 110 may extend from the top surface of the semiconductor substrate in the third direction D3. Furthermore, the plurality of dam structures 110 may surround edges of the main chip region MC several times. According to some example embodiments, an insulation film may be formed on the top surfaces of the plurality of dam structures 110. According to some example embodiments, embossed patterns may be formed on the top surfaces of the plurality of dam structures 110. The embossed patterns may include embossed structures protruding from the top surface of the insulation film.

The passivation layer 200 may include the main chip protecting layer 210 that covers the main chip region MC and the plurality of bridge patterns 220 that extend across portions of the plurality of dam structures 110 in the form of bridges adjacent to one another and connecting the main chip protecting layer 210 to the scribe lane region SL. The open portion of the scribe lane region SL not covered by the plurality of bridge patterns 220 may be larger than the portion of the scribe lane region SL covered by the plurality of bridge patterns 220. In other words, width W2 of the open portion may be greater than width W1 of the bridge patterns 220.

The number and the width W1 of the plurality of bridge patterns 220 are adjusted for smooth current movement via a seed layer on the plurality of bridge patterns 220 while reducing or minimizing a stress increase during a die sawing operation. In other words, the number and the width W1 of the plurality of bridge patterns 220 may be adjusted by taking factors including diameter of a semiconductor substrate, number of bumps, height of the bumps, thickness of a seed layer, and type of electroplating into account.

Although FIG. 3 shows that the plurality of bridge patterns 220 extend across portions of the plurality of dam structures 110 nearby the centers of the plurality of discontinuous dam structures 110, the inventive concepts are not limited thereto. Thus, according to another example embodiment, the plurality of bridge patterns 220 may also be formed to extend above top surfaces of portions of the plurality of dam structures 110 other than the center portions of the plurality of dam structures 110. A plurality of reflow solder layers 430 are formed at an interval on the main chip protecting layer 210.

Figure 4:
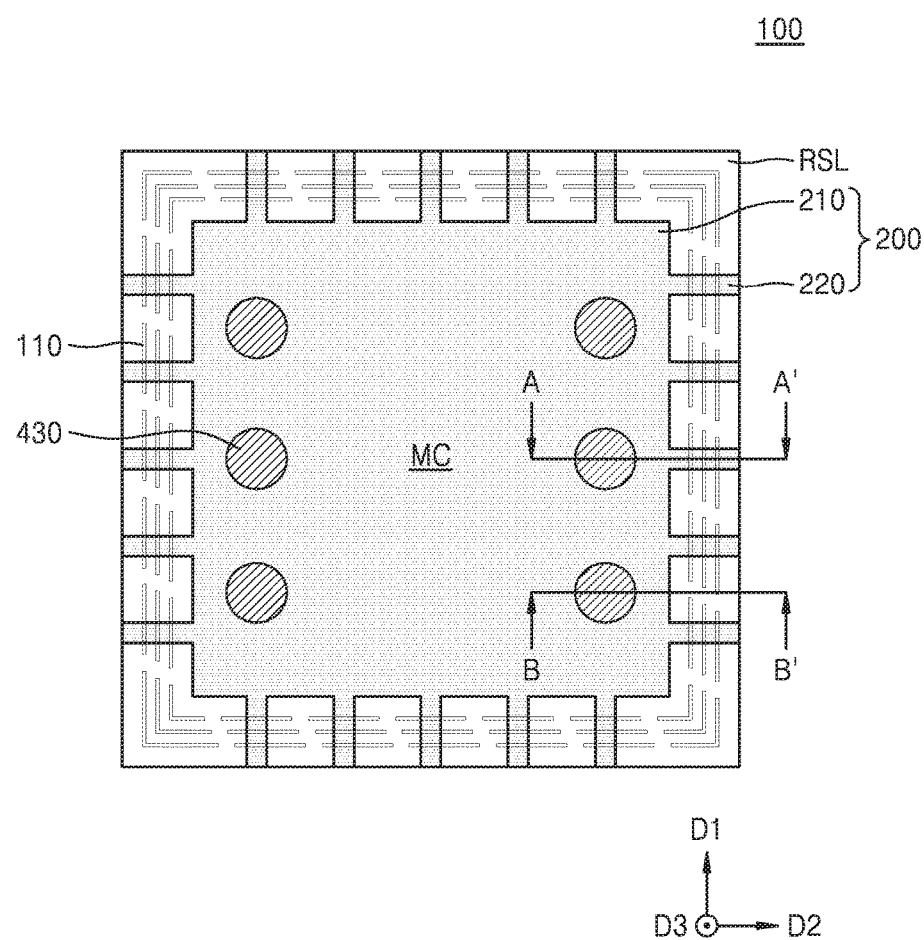
FIG. 4 is a schematic plan view of a semiconductor device according to an example embodiment.

FIG. 4 is a schematic plan view of a semiconductor device according to an example embodiment.

FIG. 4 shows one of the semiconductor devices 100 separated in a die sawing operation. The semiconductor devices 100 may include the main chip region MC and remaining scribe lane regions RSL around the main chip region MC.

The remaining scribe lane regions RSL may refer to portions of scribe lane region SL remaining after a die sawing operation is performed with regard to the semiconductor devices 100. For example, the remaining scribe lane regions RSL may include portions of the first region P1 (refer to FIG. 3) and portions of the second region P2 (refer to FIG. 3) adjacent to the first region P1.

Cut portions of the plurality of dam structures 110 and the plurality of bridge patterns 220 may exist in the remaining scribe lane regions RSL. In other words, first ends of the plurality of bridge patterns 220 may extend to nearby edges of the main chip region MC, whereas second ends of the plurality of bridge patterns 220 may extend to the outermost ends of edges of the remaining scribe lane regions RSL. During a die sawing operation, the center portions of the plurality of bridge patterns 220 in a second region of a scribe lane region SL may be diced and disappear. Therefore, the second ends of the plurality of bridge patterns 220 may have an irregular fracture plane 220E (refer to FIG. 13B) due to the die sawing operation.

Portions of the remaining scribe lane regions RSL not having thereon the plurality of bridge patterns 220 are portions where the passivation layer 200 is opened. The plurality of bridge patterns 220 may be formed on all of edges of each of the main chip regions MC, where the numbers of the plurality of bridge patterns 220 formed at respective edges of the main chip region MC may be identical to one another. Alternatively, the plurality of bridge patterns 220 may be formed only at portions of edges of the main chip region MC, where the numbers of the plurality of bridge patterns 220 formed at respective edges of the main chip region MC may be different from one another.

The plurality of reflow solder layers 430 may be arranged on a same line as some of the plurality of bridge patterns 220. However, the inventive concepts are not limited thereto.

Figure 5:
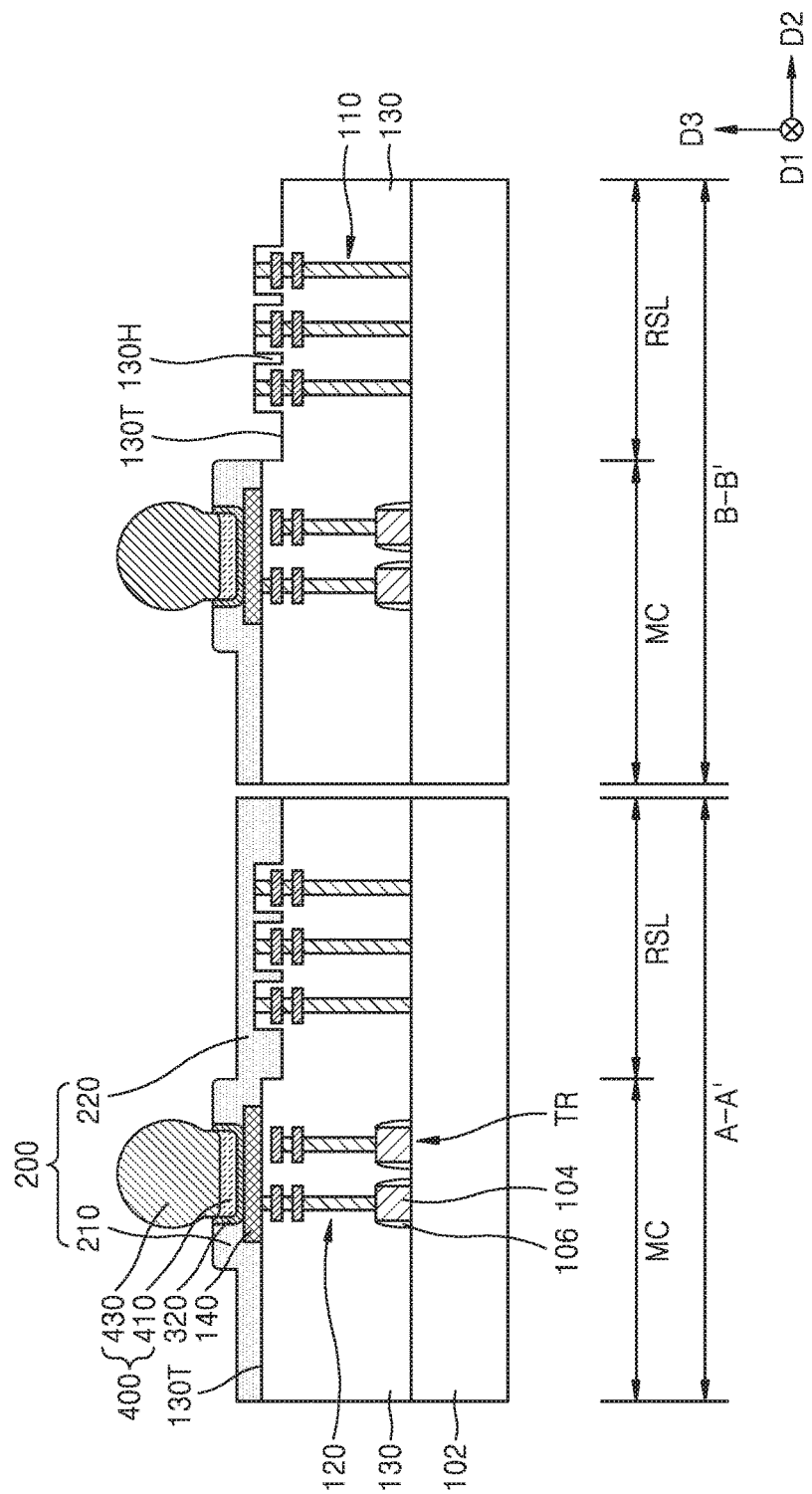
FIG. 5 is a schematic cross-sectional view of the semiconductor device, taken along a line A-A' and a line B-B' of FIG. 4.

FIG. 5 is a schematic cross-sectional diagram of the semiconductor device, obtained along a line A-A' and a line B-B' of FIG. 4.

FIG. 5 is a cross-sectional diagram showing portions of the remaining scribe lane regions RSL and the main chip region MC in order to compare a portion A-A' having formed thereon the bridge patterns 220 are formed to a portion B-B' without the bridge patterns 220.

In the main chip region MC, at least one transistor TR and an electrode structure 120 are disposed on the semiconductor substrate 102, and an insulation film 130 that covers the transistor TR and the electrode structure 120 is formed on the semiconductor substrate 102. The insulation film 130 may include a silicon oxide, a silicon nitride, or a silicon oxynitride. The bump pad 140 electrically connected to the top surface of the electrode structure 120 and the passivation layer 200 that exposes the bump pad 140 are disposed on the top surface 130T of the insulation film 130. A seed pattern layer 320, a pillar layer 410, and a solder layer 420 are disposed on the bump pad 140 in the order stated.

The top surface 130T of the insulation film 130 at the main chip region MC is covered by the main chip protecting layer 210. Both the portion A-A' having formed thereon the bridge patterns 220 and the portion B-B' without the bridge patterns 220 have the structure.

The plurality of dam structures 110 are disposed above the semiconductor substrate 102 in the remaining scribe lane regions RSL, and the insulation film 130 surrounding the plurality of dam structures 110 is disposed on the semiconductor substrate 102. According to some example embodiments, embossed patterns (not shown) may be formed on the top surfaces of the plurality of dam structures 110. Trenches 130H having relatively large aspect ratios are formed between the plurality of dam structures 110, where the trenches 130H are covered by the bridge patterns 220 at the portion A-A' having formed thereon the bridge patterns 220, whereas the top surface 130T of the insulation film 130 is exposed at the portion B-B' without the bridge patterns 220. The bottom surfaces of the bridge patterns 220 may be formed along curves of the plurality of dam structures 110 and the trenches 130H, whereas the top surfaces of the bridge patterns 220 may be substantially flat. The reason thereof may be characteristics of a material constituting the passivation layer 200. In other words, due to characteristics of a polymer-based material, such as a photosensitive polyimide, the bottom surfaces of the bridge patterns 220 may be formed along curvatures, whereas the top surfaces of the bridge patterns 220 may be flat.

As described above, due to the bridge patterns 220, portions of the remaining scribe lane regions RSL may have flat top surfaces, and the remaining portions of the remaining scribe lane regions RSL may have curved top surfaces. Here, no opening defect or increased resistance may occur at a seed layer (not shown) formed along the flat top surfaces of the bridge patterns 220, the seed layer may function as a path in which a current uniformly flows, and thus the pillar layer 410 and the solder layer 420 having uniform heights may be formed during an electroplating operation for forming the bump 400.

FIGS. 6A through 13B are plan view diagrams and cross-sectional diagrams for describing a method of fabricating a semiconductor device according to an example embodiment.

FIGS. 6A through 13B are plan view diagrams and sectional diagrams showing operations for fabricating the semiconductor devices 100. Here, FIGS. 6A, 7A, 8A, 9A, 10A, 11A, 12A, and 13A are plan view diagrams showing the portion II of I in closer details, whereas FIGS. 6B, 7B, 8B, 9B, 10B, 11B, 12B, and 13B are cross-sectional diagrams obtained along lines X-X' of FIGS. 6A, 7A, 8A, 9A, 10A, 11A, 12A, and 13A, respectively.

Figure 6A:
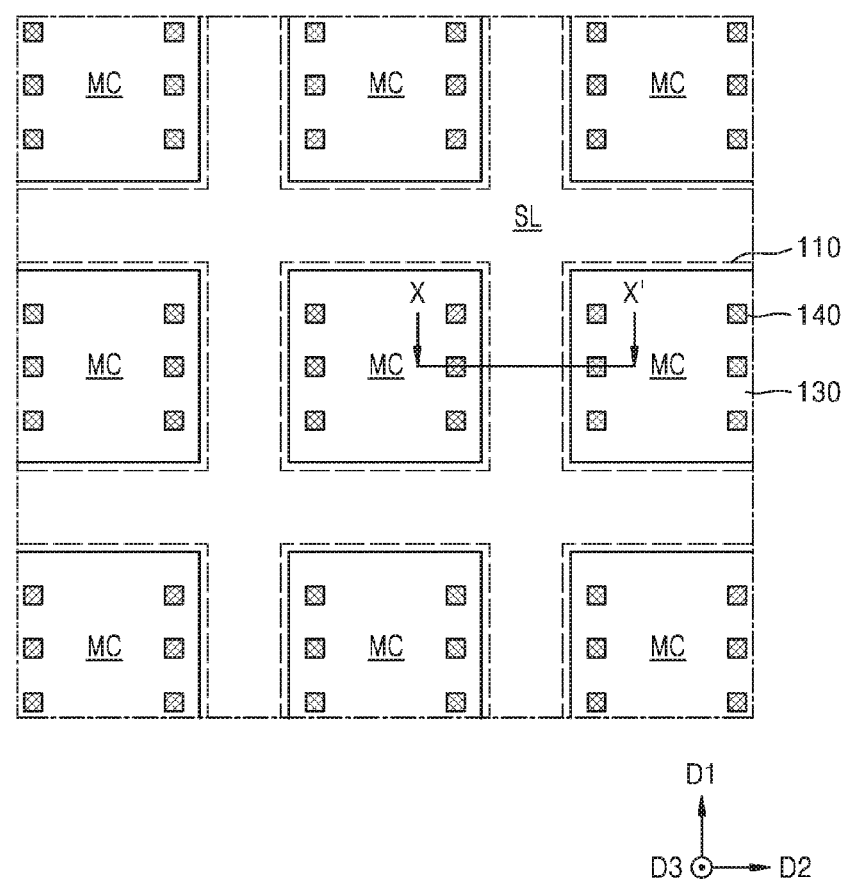
FIGS. 6A through 13B are plan views and cross-sectional views for describing a method of fabricating a semiconductor device according to an example embodiment.
Figure 6B:
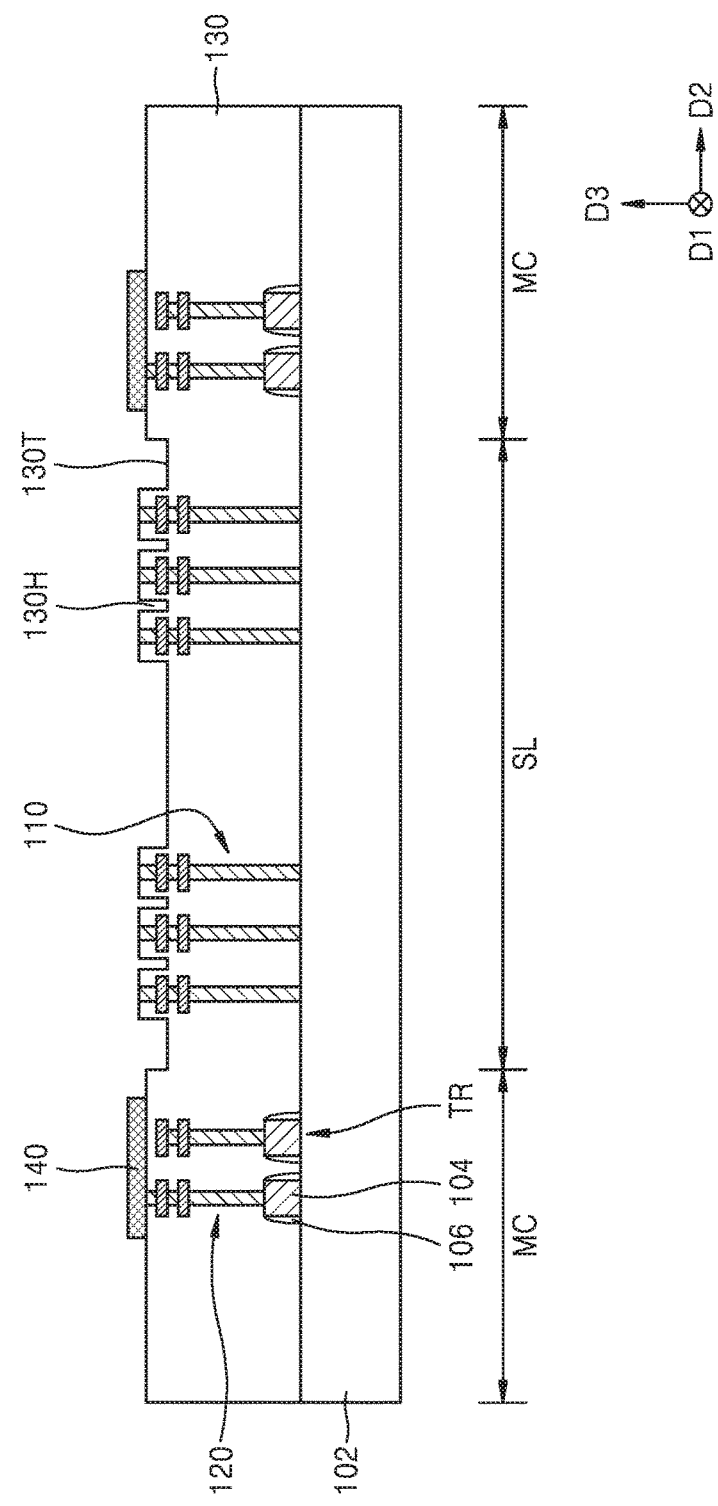

Referring to FIGS. 6A and 6B, the transistor TR and the electrode structure 120 are formed in the main chip region MC of the semiconductor substrate 102, whereas the dam structures 110 are formed in the scribe lane region SL.

The transistor TR may be formed by forming a gate electrode 104, forming spacers 106 on two opposite side surfaces of the bump pad 140, and implanting an impurity to portions of the semiconductor substrate 102 at two opposite side of the gate electrode 104.

A method of forming the transistor TR will be briefly described below. A gate forming layer (not shown) is formed on the semiconductor substrate 102. A mask pattern (not shown) for forming a plurality of gate electrodes 104 is formed on the gate forming layer. The gate forming layer is etched by using the mask pattern as an etching mask, thereby forming the plurality of gate electrodes 104 on the semiconductor substrate 102. A spacer forming layer (not shown) covering the gate electrode 104 is formed. The spacers 106 may be formed on two opposite side surfaces of each of the plurality of gate electrodes 104 by anisotropically etching the spacer forming layer. A sources and a drain are formed by implanting an impurity into portions of the semiconductor substrate 102 at two opposite side of the gate electrode 104.

The insulation film 130 that surrounds the transistor TR, the electrode structure 120, and the dam structures 110 is formed on the semiconductor substrate 102. The insulation film 130 may include a silicon oxide, a silicon nitride, or a silicon oxynitride. The insulation film 130 may include a plurality of interlayer insulation films.

During an operation for forming the electrode structure 120 in the main chip region MC, the dam structures 110 may be formed in the scribe lane region SL. In other words, the dam structures 110 may be formed in an existing semiconductor operation without performing an additional operation for forming the dam structures 110.

According to some example embodiments, the dam structures 110 and the electrode structure 120 may include tungsten (W), a tungsten alloy, copper (Cu), or a copper alloy. Alternatively, the dam structures 110 and the electrode structure 120 may include aluminium (Al), rhodium (Rh), osmium (Os), titanium (Ti), tantalum (Ta), palladium (Pd), platinum (Pt), molybdenum (Mo), a metal silicide, or a combination thereof.

According to some example embodiments, the dam structures 110 and the electrode structure 120 may include a plurality of vias and a plurality of metal wire layers. The plurality of vias may extend in a third direction, whereas the plurality of metal wire layers may extend in a second direction. The dam structures 110 and the electrode structure 120 may be formed by patterning the plurality of vias and the plurality of metal wire layers to desired shapes in a photography operation and an etching operation.

The bump pad 140 may be formed on the top surface 130T of the insulation film 130 in the main chip region MC. The bump pad 140 may be electrically connected to a circuit of an integrated circuit device, where a bump (not shown) or a re-wire (not shown) may be formed on the top surface of the bump pad 140. The bump pad 140 is an element via which an electric signal is input/output to/from the semiconductor substrate 102, where the plurality of bump pads 140 are disposed on the semiconductor substrate 102 and may include a metal with low specific resistivity, such as aluminium (Al) and copper (Cu).

The bump pad 140 may be electrically connected to the electrode structure 120 therebelow via a via. The bump pad 140 having a desired shape may be formed by depositing a metal, such as aluminium (Al), on the insulation film 130 and performing a photography operation and an etching operation. Since the photography operation and the etching operation are commonly known operations, detailed description thereof will be omitted.

Figure 7A:
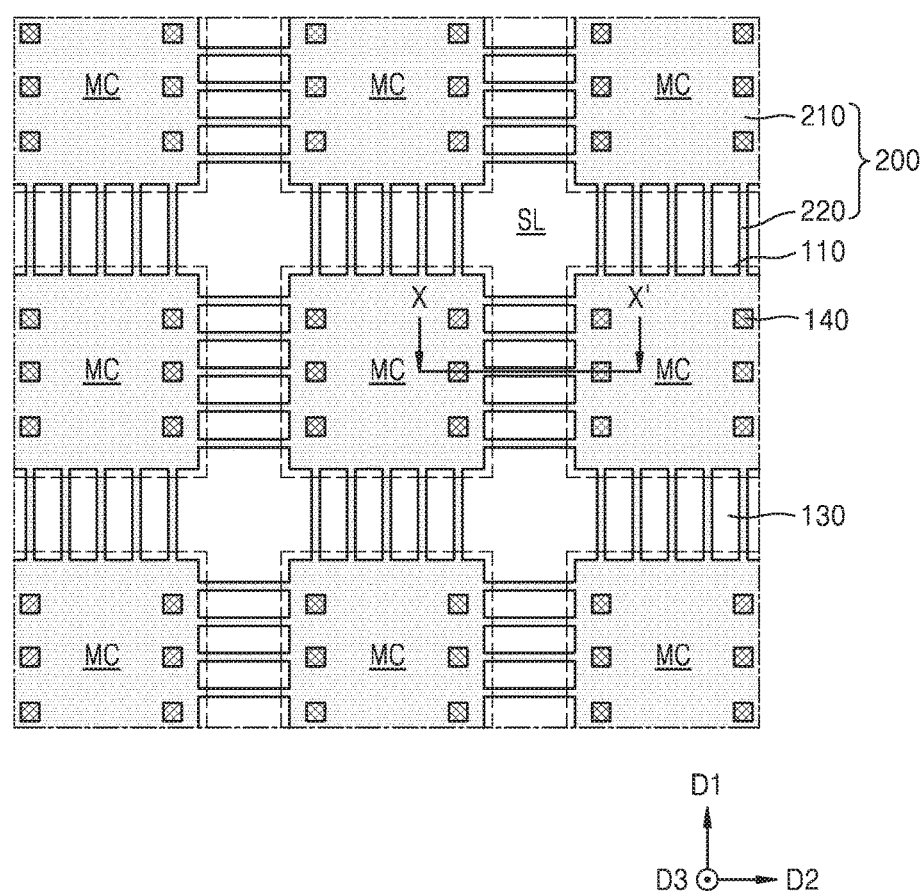
Figure 7B:
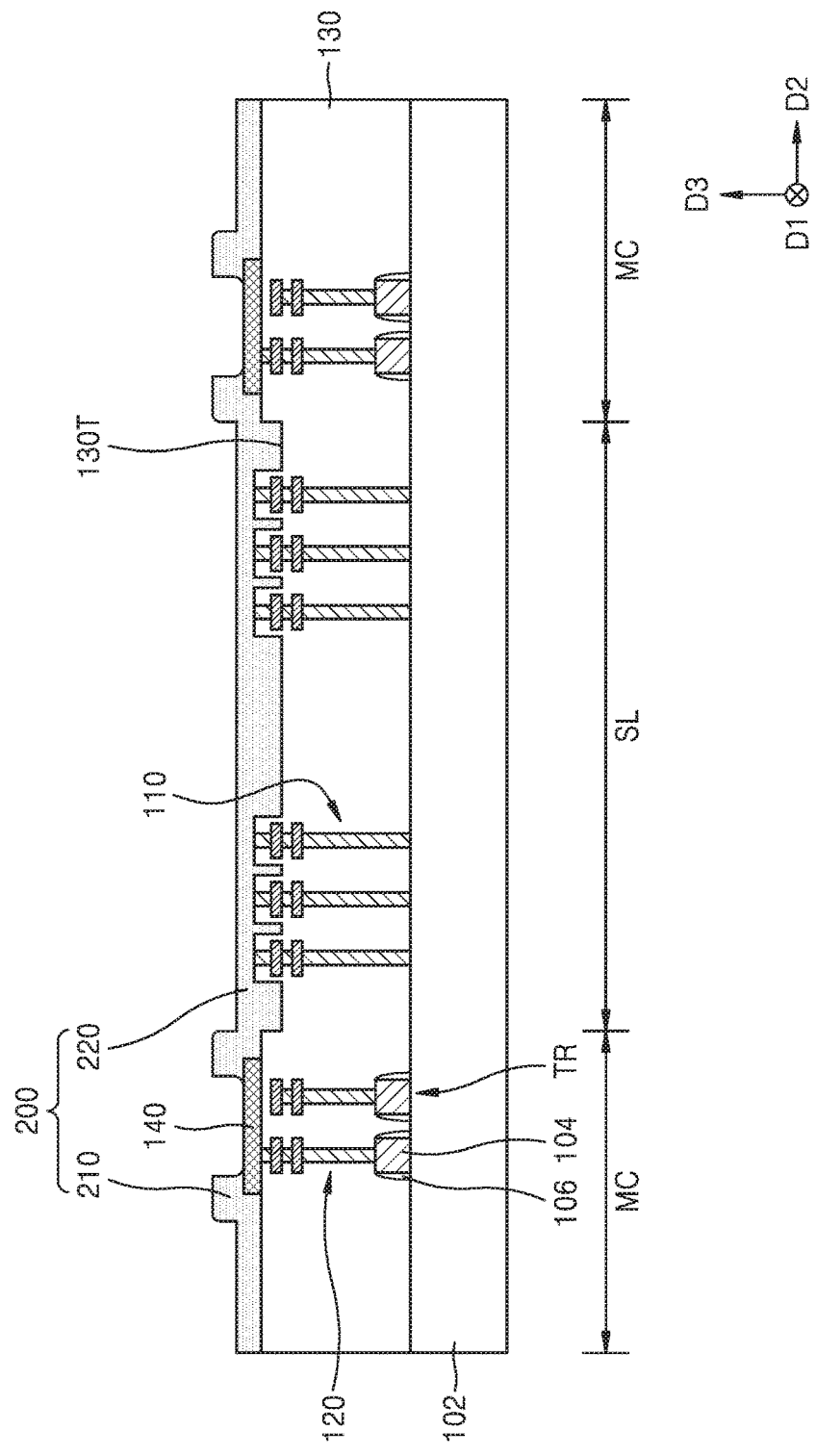

Referring to FIGS. 7A and 7B, the passivation layer 200 may be formed on the bump pads 140 and the insulation film 130.

The passivation layer 200 may include the main chip protecting layer 210 that exposes the center portions of the bump pads 140 in the main chip region MC and the plurality of bridge patterns 220 that are formed on the plurality of dam structures 110 in the scribe lane region SL.

The bump pads 140 may be exposed by the passivation layer 200, which is the final protection layer of the circuit of the integrated circuit device. The passivation layer 200 may be formed on portions of the top surface of the main chip region MC other than portions of the main chip region MC having formed thereon the bump pads 140 and may be insulated at the portions without the bump pads 140. Furthermore, the passivation layer 200 protects the top surface of the main chip region MC from outside impurities and physical shocks.

Generally, the passivation layer 200 may include any one material selected from among a silicon oxide, a silicon nitride, polyimide (PI), photosensitive polyimide (PSPI), benzocyclobutene (BCB), polybenzoxxanole (PBO), bismaleimide triazine (BT), a phenolic resin, an epoxy, or an equivalent material.

According to an example embodiment, in order to cover the trenches 130H (refer to FIG. 6B) that have relatively large aspect ratios and are formed between the plurality of dam structures 110 with the plurality of bridge patterns 220 and to form the plurality of bridge patterns 220 having substantially flat surfaces, a polymer-based material with high fluidity may be used. Due to characteristics of polymer-based materials, the bottom surfaces of the plurality of bridge patterns 220 may be formed along curves of the trenches 130H and the top surfaces of the plurality of bridge patterns 220 may be flat surfaces. Furthermore, in order to easily pattern the plurality of bridge patterns 220, photosensitive polyimide may be used.

In other words, after a passivation forming layer (not shown) including photosensitive polyimide is formed to entirely cover the top surface 130T of the insulation film 130 and the bump pads 140, the passivation layer 200 having a desired shape may be formed by performing a photography operation and an etching operation.

Figure 8A:
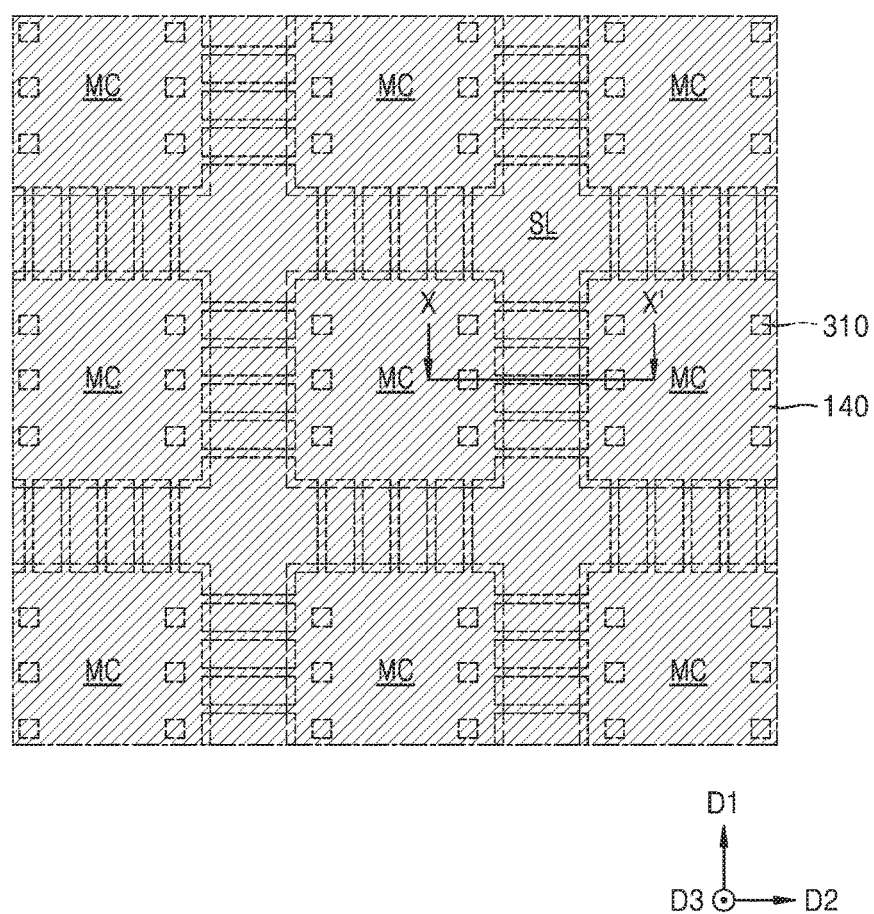
Figure 8B:
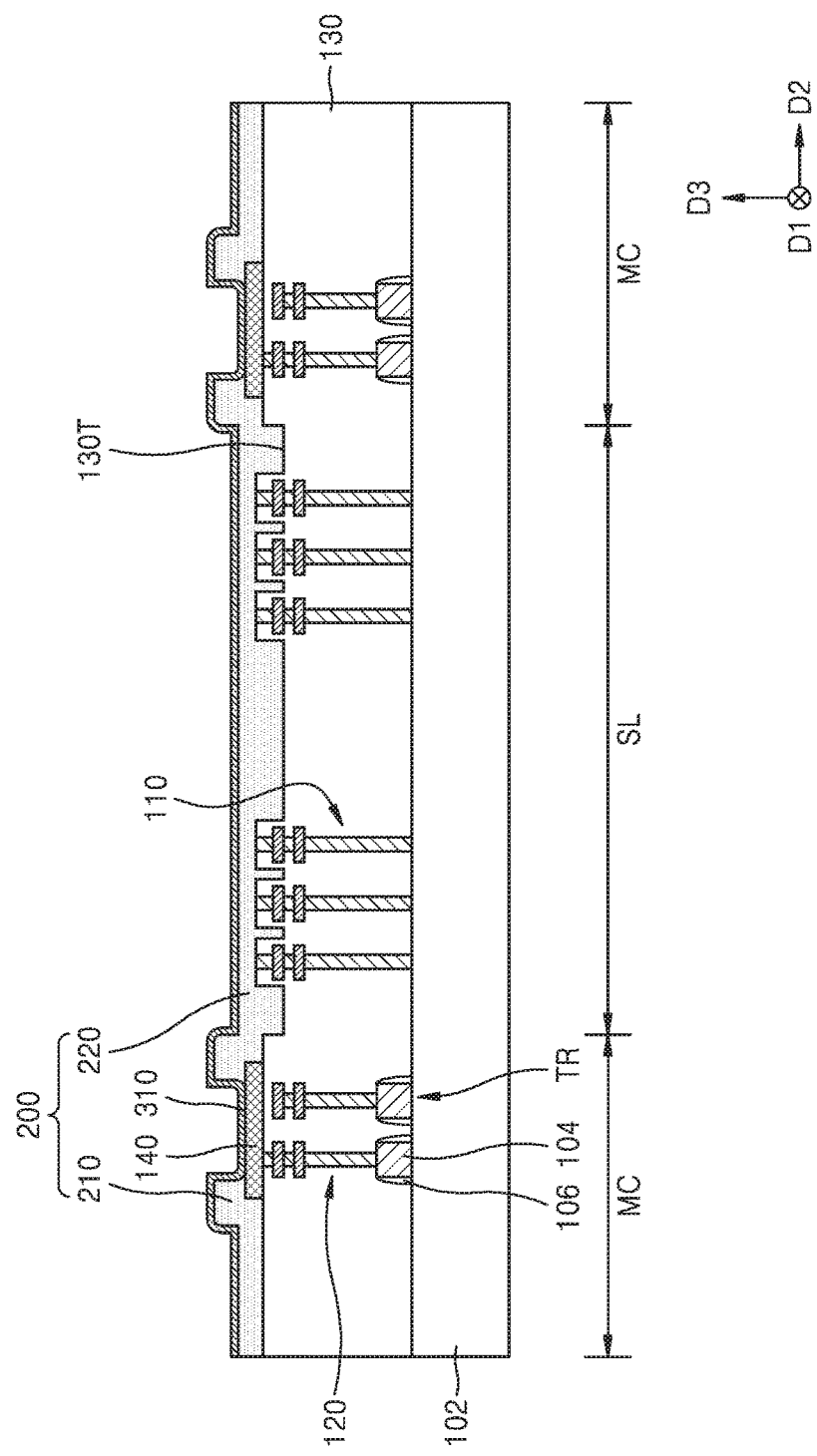

Referring to FIGS. 8A and 8B, a seed layer 310 is formed on the exposed insulation film 130, the exposed bump pads 140, and the passivation layer 200.

The seed layer 310 is formed to entirely cover the exposed insulation film 130, the exposed bump pads 140, and the passivation layer 200 and may be formed via an electroless plating operation, a chemical vapour deposition operation, or a physical vapour deposition operation. For example, the seed layer 310 may include one of metals, such as copper (Cu), nickel (Ni), titanium (Ti), tungsten (W), tin (Sn), and silver (Ag), or an alloy thereof and may have a single layer structure or a multilayer structure.

Figure 12A:
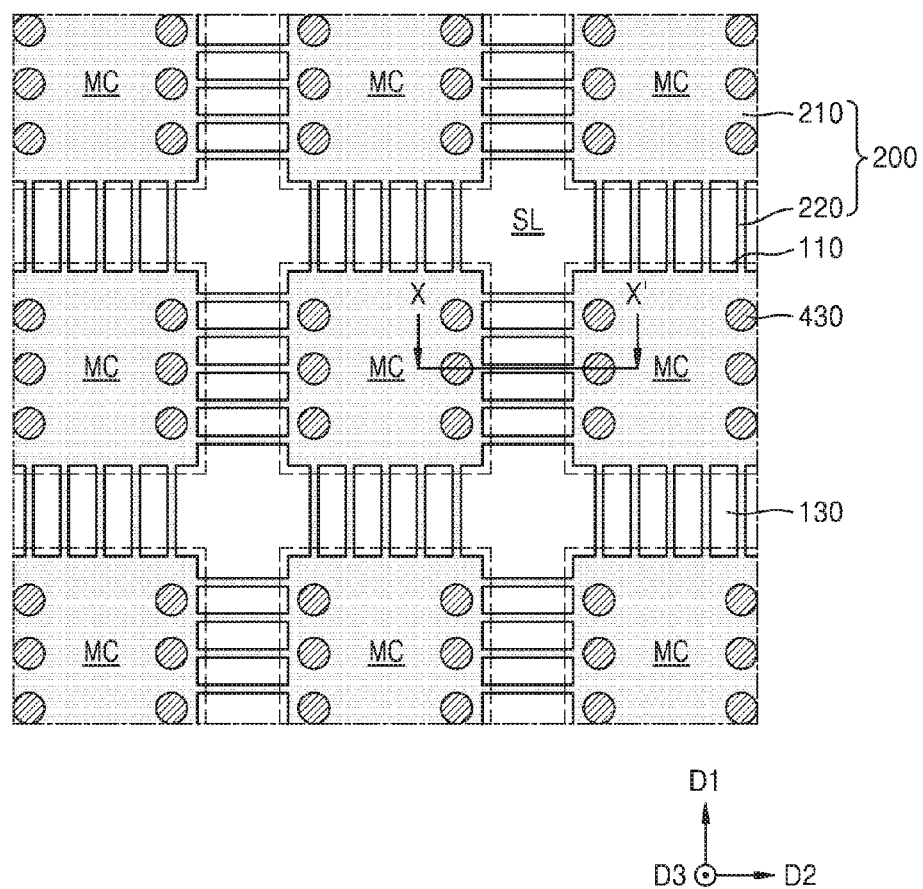
Figure 12B:
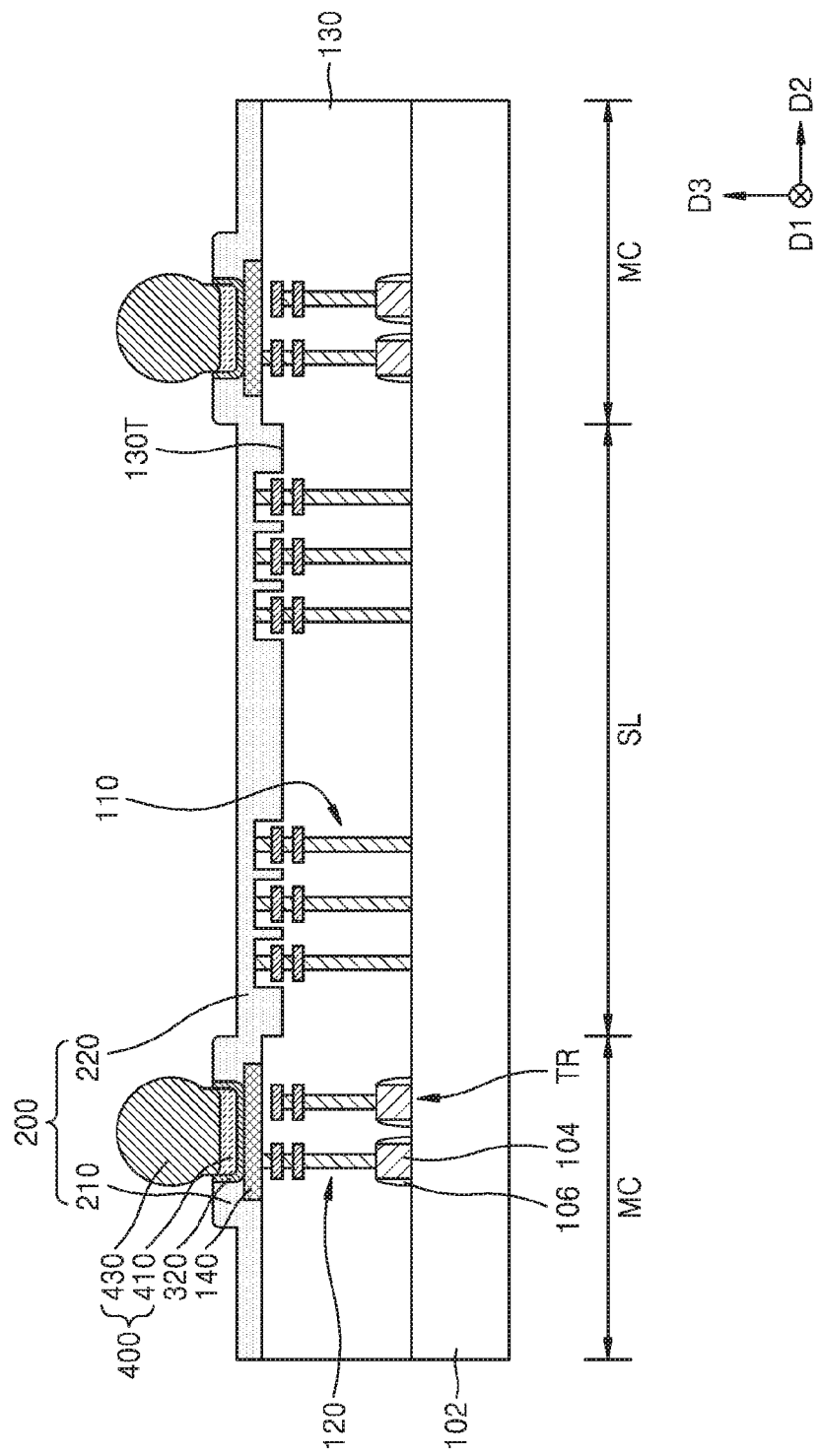

The seed layer 310 functions as a seed for forming the bumps 400 (refer to FIG. 12B). In other words, when the bumps 400 is formed in an electroplating operation, the seed layer 310 provides a path in which a current may flow, and thus the bumps 400 may be formed above the seed layer 310.

When the seed layer 310 is formed directly on the insulation film 130 in the scribe lane region SL, the seed layer 310 may not be uniformly formed along sidewalls of the trench 130H (refer to FIG. 6B). Therefore, an opening defect or increased resistance of the seed layer 310 may occur.

Curves due to the trenches 130H are reduced by the plurality of bridge patterns 220 extending across the top surfaces of the plurality of dam structures 110 in the scribe lane region SL. Therefore, while the plurality of dam structures 110 are being used, the seed layer 310 may be uniformly formed on the plurality of bridge patterns 220, thereby providing a path in which a current may stably flow during an electroplating operation for forming bumps. Therefore, an increase of the resistance of the seed layer 310 may be reduced or prevented, thereby reducing a distribution of heights of bumps formed on the bump pads 140.

Figure 9A:
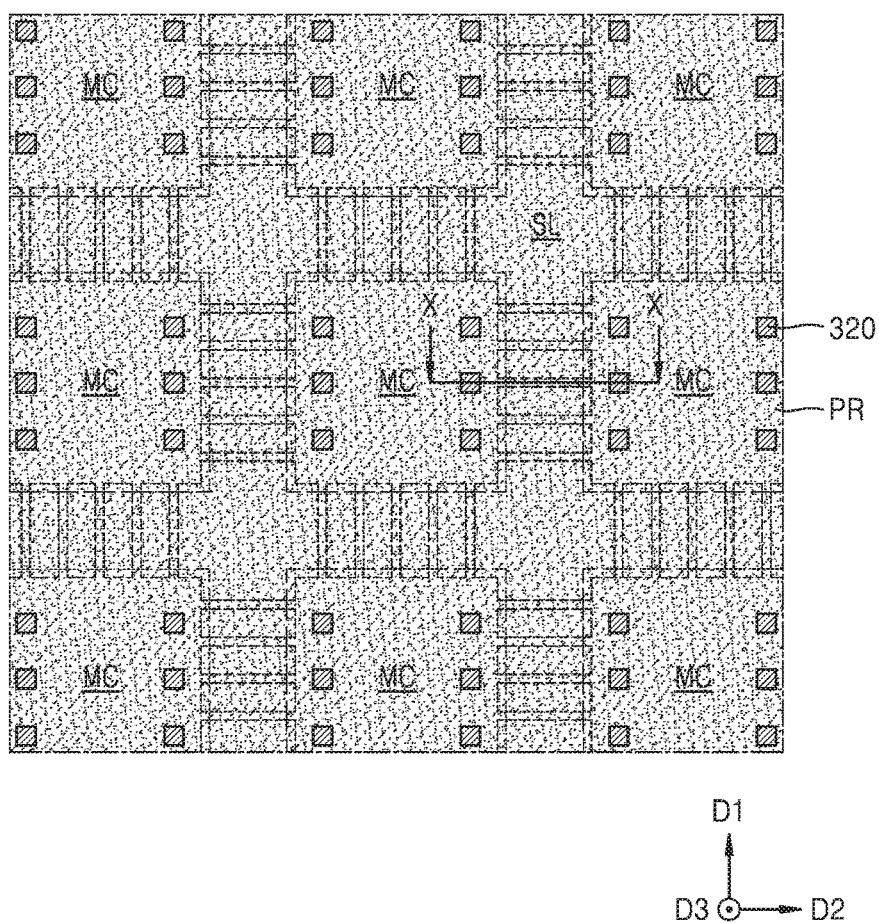
Figure 9B:
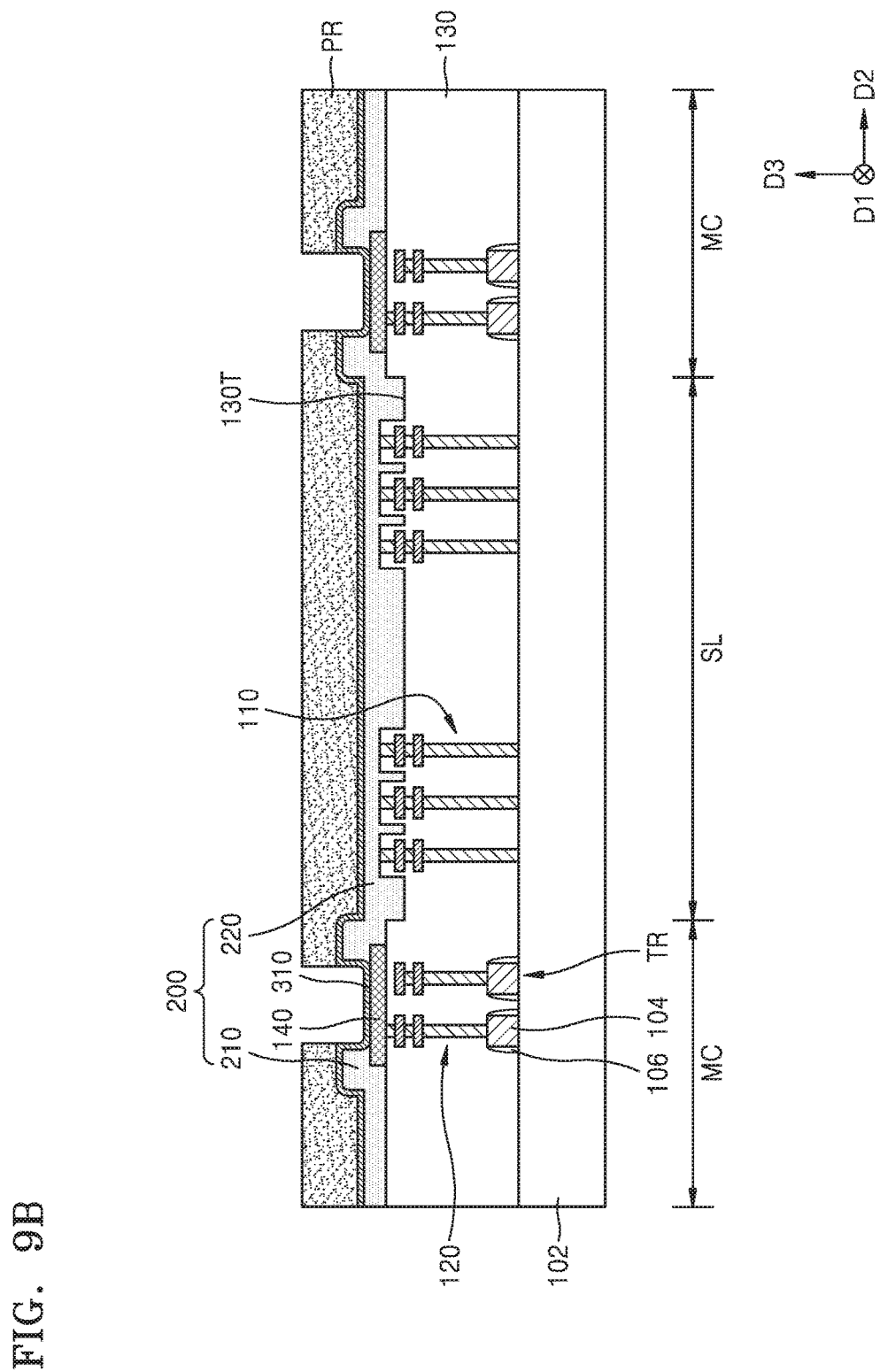

Referring to FIGS. 9A and 9B, a photoresist pattern PR is formed on the seed layer 310.

The photoresist pattern PR may be formed as a pattern that exposes a portion of the seed layer 310.

The exposed portion of the insulation film 130 may include a portion that contacts the bump pad 140. Since the portion of the seed layer 310 exposed by the photoresist pattern PR corresponds to a portion on which the bump 400 (refer to FIG. 12B) is formed in a later operation, if there are the plurality of bump pads 140, a plurality of portions of the seed layer 310 may be exposed by the photoresist pattern PR in correspondence to the respective bump pads 140.

Figure 10A:
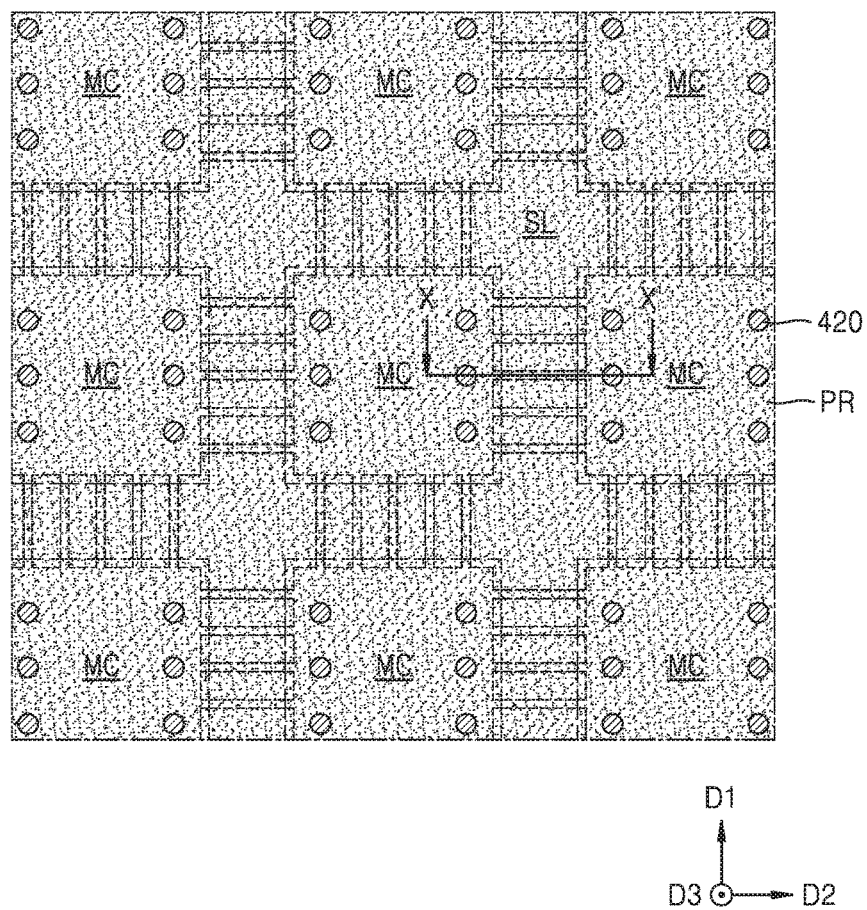
Figure 10B:
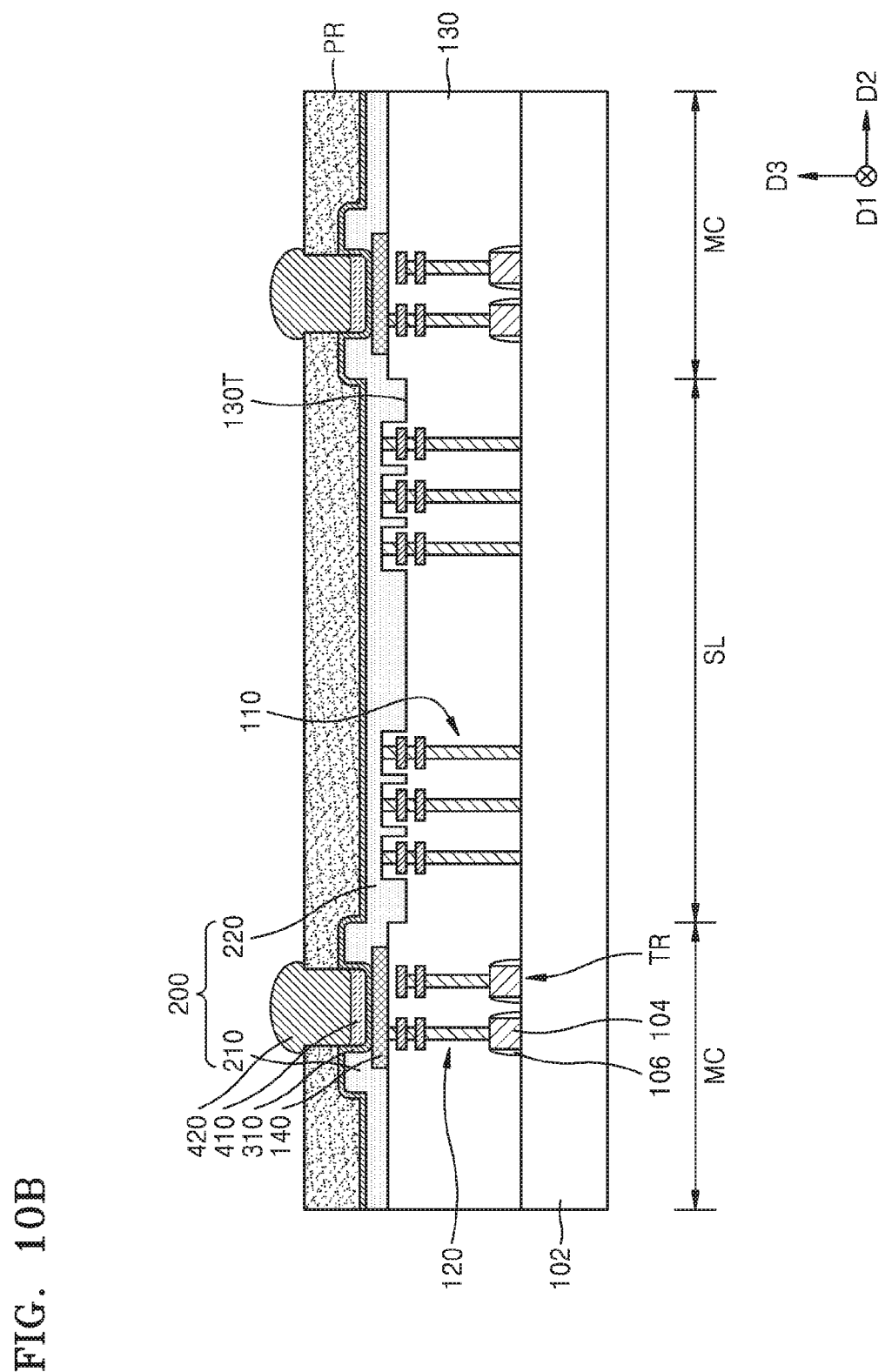

Referring to FIGS. 10A and 10B, a double layer including the pillar layer 410 and a solder layer 420 may be formed on the seed layer 310 having formed thereon the photoresist pattern PR. However, the inventive concepts are not limited thereto, and a single layer including the solder layer 420 may be formed instead.

The pillar layer 410 may be formed on a portion of the top surface of the seed layer 310 exposed by the photoresist pattern PR. The pillar layer 410 may be formed by performing an electroplating operation. An electroplating operation for forming the pillar layer 410 may be referred to as a primary electroplating operation.

In order to form the pillar layer 410, the semiconductor substrate 102 having formed thereon the photoresist pattern PR is put into a bath and the primary electroplating operation may be performed thereon. For example, the pillar layer 410 may include one selected from among metals including copper (Cu), nickel (Ni), and gold (Au), an alloy of the metals, or a multi-layers of a plurality of metals selected from among copper (Cu), nickel (Ni), and gold (Au).

The pillar layer 410 may be formed to fill only a portion of a region exposed by the photoresist pattern PR instead of filling the entire region exposed by the photoresist pattern PR. In other words, the pillar layer 410 may be formed to have a thickness smaller than that of the photoresist pattern PR.

The solder layer 420 may be formed on the pillar layer 410. The solder layer 420 may be formed to have a top surface smoothly connected to the top surface of the photoresist pattern PR or protruding more than the top surface of the photoresist pattern PR. The solder layer 420 may be formed by performing an electroplating operation. In order to distinguish the electroplating operation for forming the solder layer 420 from the primary electroplating operation for forming the pillar layer 410, the electroplating operation for forming the solder layer 420 may be referred to as a secondary electroplating operation.

In order to form the solder layer 420, the semiconductor substrate 102 having formed thereon the pillar layer 410 is put into a bath different from the bath used in the primary electroplating operation and the secondary electroplating operation may be performed thereon. The solder layer 420 may include an alloy of tin (Sn) and silver (Ag), where a relatively small amount of copper (Cu), palladium (Pd), bismuth (Bi), and/or antimony (Sb) may be added thereto.

Since a current is uniformly and smoothly supplied to the seed layer 310 throughout the semiconductor substrate 102, the pillar layer 410 and the solder layer 420 may be formed to have uniform heights throughout the semiconductor substrate 102. In other words, distribution of heights of bumps may be reduced, and thus reliability and life expectancy of the semiconductor device 100 may be improved.

Figure 11A:
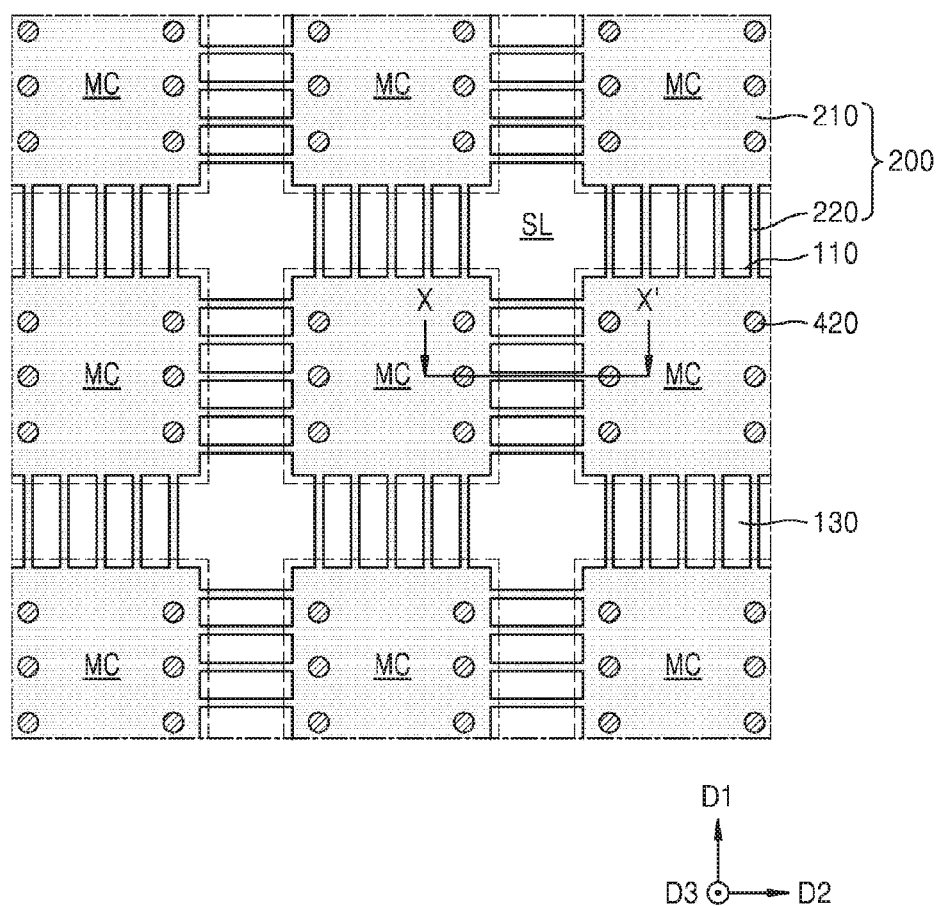
Figure 11B:
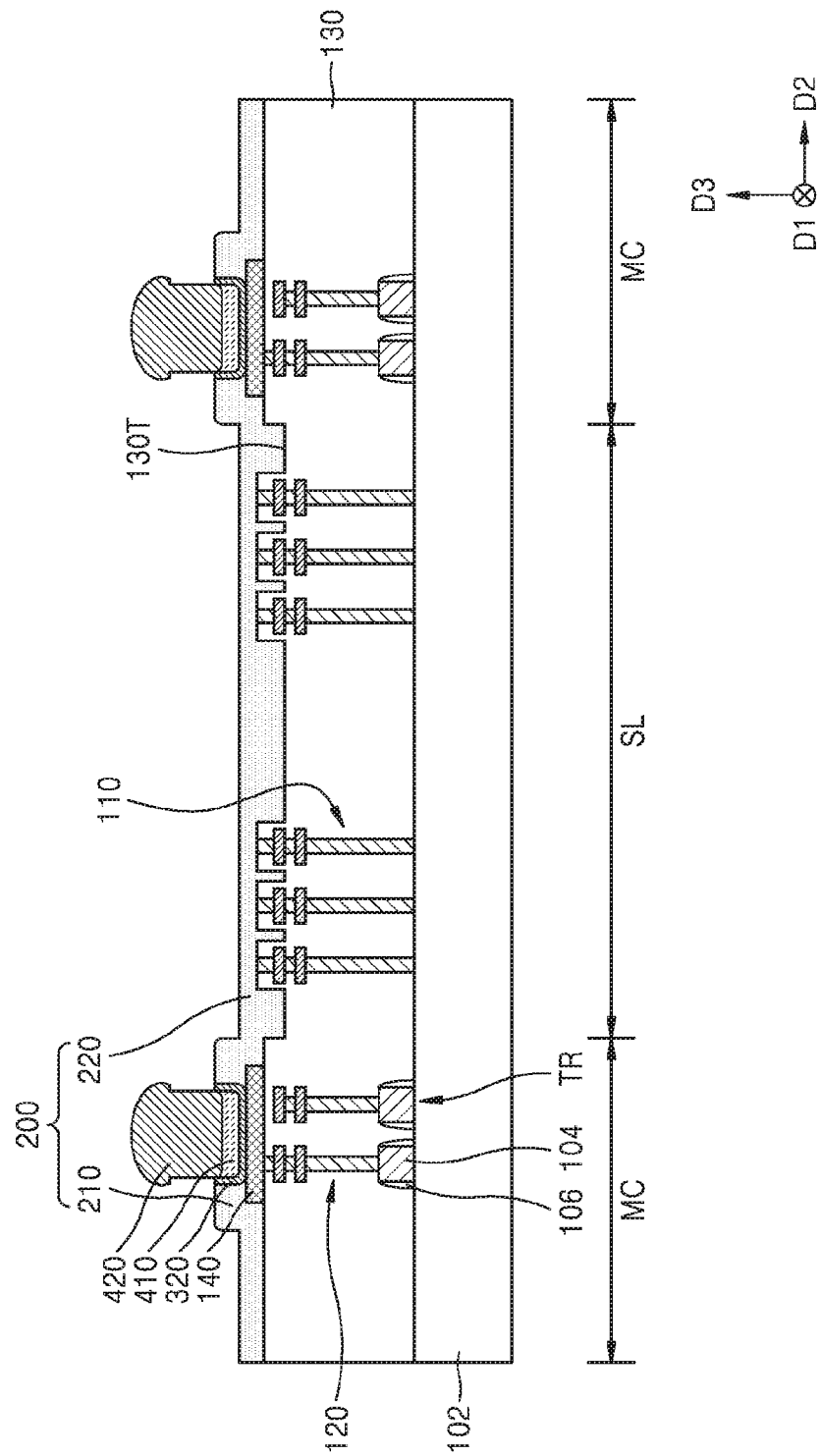

Referring to FIGS. 11A and 11B, after the photoresist pattern PR (refer to FIG. 10B) is removed, the seed pattern layer 320 is formed on the bump pads 140 by removing a portion of the seed layer 310 (refer to FIG. 10B).

In order to remove the photoresist pattern PR, a stripping operation or an ashing operation may be performed. After the photoresist pattern PR is removed, unnecessary portions of the seed layer 310 exposed to the external environment are etched by using the pillar layer 410 and the solder layer 420 as an etching mask.

Referring to FIGS. 12A and 12B, the bumps 400 are formed by performing a reflowing operation on the solder layer 420 (refer to FIG. 11B).

The reflowing operation is performed by heat-treating the semiconductor substrate 102 from which the photoresist pattern PR (refer to FIG. 10B) and a portion of the seed layer 310 (refer to FIG. 10B) are removed. The reflowing operation may be performed at a temperature within a range from about 200° C. to about 300° C. By performing the reflowing operation, the solder layer may be melted, and thus a reflow solder layer 430 may be formed. After being melted, the solder layer may not collapse and form the reflow solder layer 430 on the pillar layer 410 due to surface tension, where an inter-metallic compound may be formed at the interface between the reflow solder layer 430 and the pillar layer 410. The diameter of the reflow solder layer 430 may be greater than that of the pillar layer 410.

The bump 400 may include the pillar layer 410 and the reflow solder layer 430. However, the inventive concepts are not limited thereto, and the bump 400 may include the reflow solder layer 430 only. Types of the bump 400 may vary according to semiconductor devices to fabricate. The bump 400 may function as an external connecting terminal and may be a contact point electrically connected to an external device. Although from dozens of to hundreds of the bumps 400 may exist within the main chip region MC, only the six bumps 400 are shown for convenience of explanation.

Figure 13A:
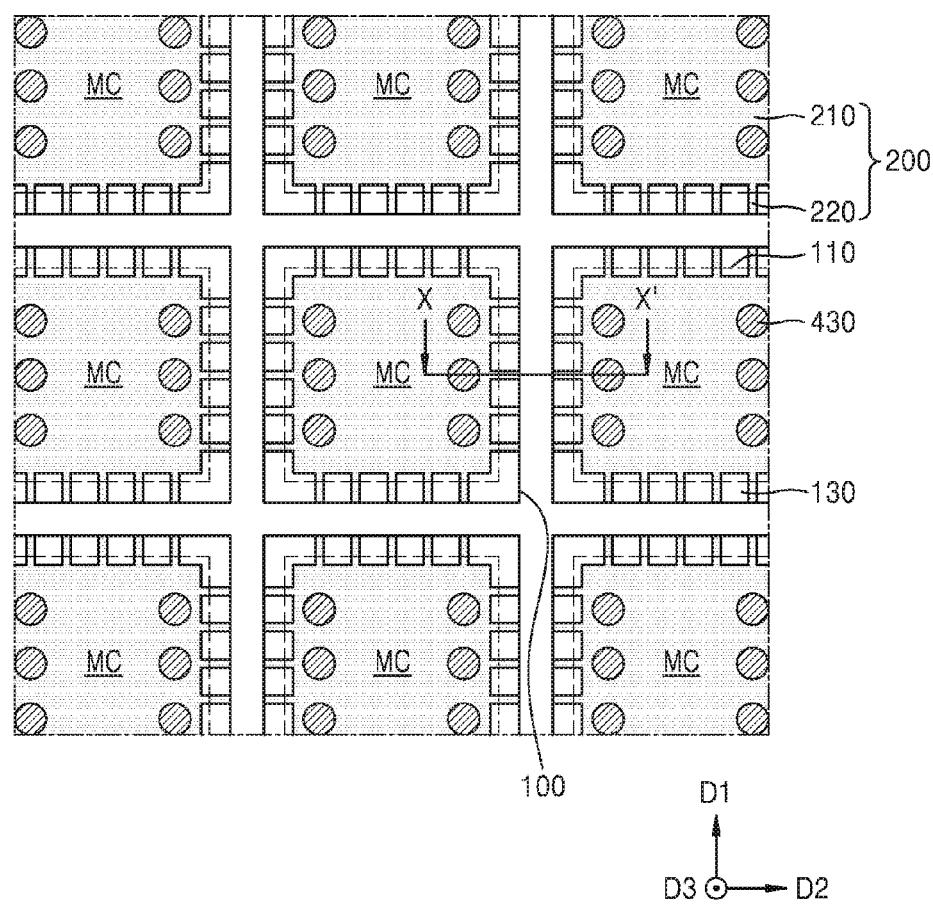

FIGS. 13A and 13B show semiconductor devices that are physically separated as a sawing blade dices the semiconductor substrate 102 along the scribe lane region SL.

The bumps 400 formed at each of the semiconductor devices 100 may have a same height. Furthermore, cut portions of the plurality of dam structures 110 and the plurality of bridge patterns 220 may exist in the remaining scribe lane regions RSL. In other words, first ends of the plurality of bridge patterns 220 may extend to nearby edges of the main chip region MC, whereas second ends of the plurality of bridge patterns 220 may extend to the outermost ends of edges of the remaining scribe lane regions RSL. During a die sawing operation, the center portions of the plurality of bridge patterns 220 in a second region of a scribe lane region SL may be diced and disappear. Therefore, the second ends of the plurality of bridge patterns 220 may have the irregular fracture plane 220E due to the die sawing operation.

Figure 14A:
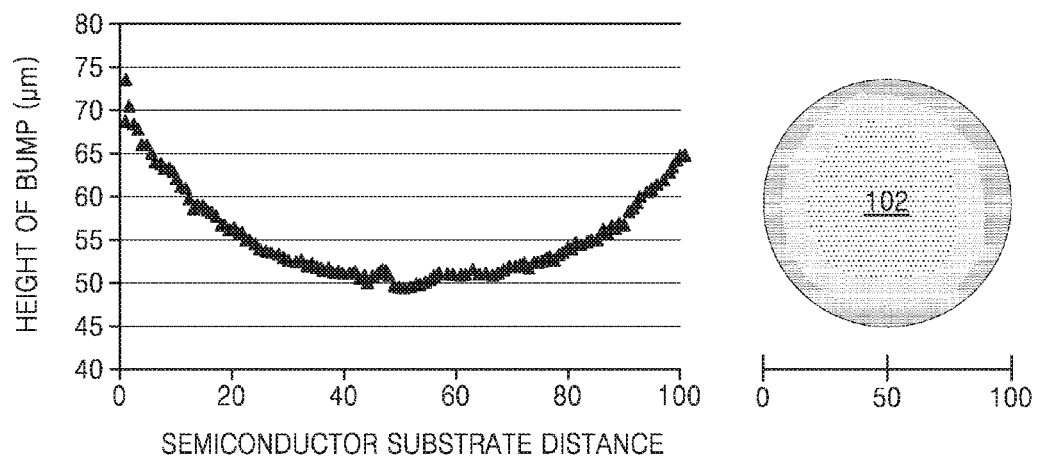
FIGS. 14A and 14B are graphs showing distributions of heights of bumps in a semiconductor device according to a comparative embodiment and a semiconductor device according to an example embodiment of the inventive concepts.
Figure 14B:
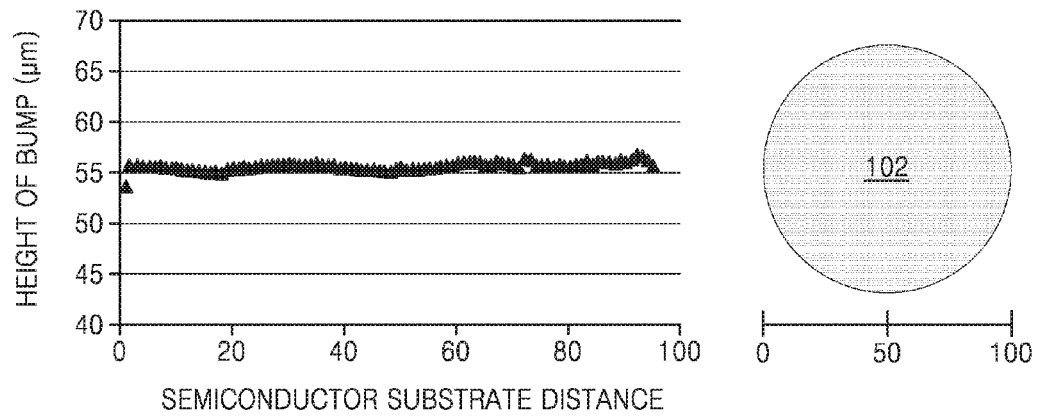

FIGS. 14A and 14B are graphs showing distributions of heights of bumps in a semiconductor device according to a comparative embodiment and a semiconductor device according to an example embodiment of the inventive concepts.

FIGS. 14A and 14B show distributions of heights of bumps in a semiconductor device in which a plurality of bridge patterns are not formed in a scribe lane region according to a comparative embodiment and a semiconductor device according to an example embodiment of the inventive concepts.

According to FIG. 14A, due to dam structures formed in a scribe lane region and trenches that have relatively large aspect ratios and are formed between the dam structures, an opening defect or increased resistance of a seed layer occurs and flow of a current becomes difficult toward the semiconductor substrate 102, and thus, height of bumps nearby the center of the semiconductor substrate 102 is relatively small (about 50 μm). In other words, since heights of bumps of a plurality of semiconductor devices separated from the semiconductor substrate 102 differ from one another, reliability and life expectancy of the semiconductor devices may be poor. Furthermore, in order to compensate for the non-uniformity of the heights of the bumps, it may be necessary to perform an additional semiconductor operation or to increase the height of the seed layer, and thus, the overall cost for fabricating the semiconductor devices may increase.

On the contrary, FIG. 14B shows that, as dam structures are formed in a scribe lane region and portions of trenches that have relatively large aspect ratios and are formed between the dam structures are flattened by a plurality of bridge patterns, a current flows along a seed layer formed on the plurality of bridge patterns during an electroplating operation, and thus bumps throughout the semiconductor substrate 102 have an uniform height of about 550 μm. In other words, since bumps of a plurality of semiconductor devices separated from the semiconductor substrate 102 have a uniform height, reliability and life expectancy of the semiconductor devices may be higher.

Figure 15:
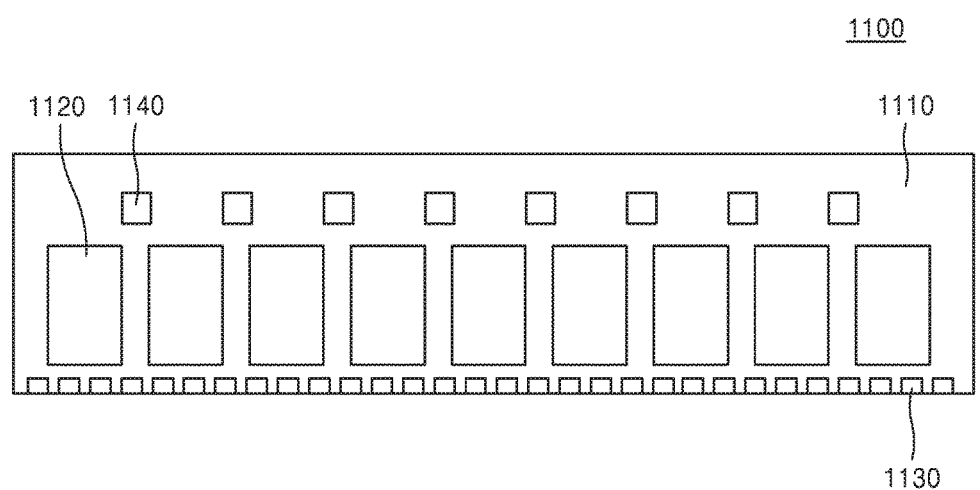
FIG. 15 is a plan view of a memory module including a semiconductor device according to an example embodiment.

FIG. 15 is a plan view of a memory module including a semiconductor device according to an example embodiment.

Referring to FIG. 15, a memory module 1100 includes a module substrate 1110 and a plurality of semiconductor packages 1120 attached to the module substrate 1110.

The plurality of semiconductor packages 1120 may include semiconductor devices according to an example embodiment. For example, the plurality of semiconductor packages 1120 may include the semiconductor devices 100 shown in FIG. 4.

A connector 1130 that may be inserted to a socket of a mainboard is arranged at an end of the module substrate 1110. Ceramic decoupling capacitors 1140 are disposed on the module substrate 1110. Configuration of the memory module 1100 according to the inventive concepts is not limited to the configuration shown in FIG. 15 and may vary.

While the inventive concepts have been particularly shown and described with reference to example embodiments thereof, it will be understood that various changes in form and details may be made therein without departing from the spirit and scope of the following claims.

What is claimed is:
1. A semiconductor device comprising:
a semiconductor substrate including a main chip region and a remaining scribe lane region surrounding the main chip region;
a passivation layer on the main chip region, the passivation layer including a plurality of bridge patterns extending from the main chip region in a first direction across the remaining scribe lane region;
a plurality of bump pads exposed by the passivation layer on the main chip region;
a plurality of dam structures along edges of the main chip region on the remaining scribe lane region, the plurality of bridge patterns arranged on the plurality of dam structures and having a first pitch therebetween;
a seed layer on the plurality of bump pads; and
bumps on the seed layer.

2. The semiconductor device of claim 1, wherein the plurality of bridge patterns are on all edges of the main chip region.

3. The semiconductor device of claim 1, wherein the plurality of bridge patterns are not on portions of edges of the main chip region.

4. The semiconductor device of claim 1, wherein
bottom surfaces of the plurality of bridge patterns are along curves of the plurality of dam structures; and
top surfaces of the plurality of bridge patterns are flat.

5. The semiconductor device of claim 1, wherein the passivation layer including the plurality of bridge patterns includes photosensitive polyimide.

6. The semiconductor device of claim 1, wherein the bumps are formed via an electroplating operation.

7. The semiconductor device of claim 1, wherein
the plurality of dam structures include embossed patterns on top surfaces thereof; and
the plurality of bridge patterns cover the embossed patterns.

8. The semiconductor device of claim 1, wherein
first ends of the plurality of bridge patterns extend to nearby edges of the main chip region; and
second ends of the plurality of bridge patterns extend to outermost ends of edges of the remaining scribe lane region.

9. The semiconductor device of claim 8, wherein the second ends of the plurality of bridge patterns have an irregular fracture plane.

10. The semiconductor device of claim 1, wherein the plurality of dam structures extend along edges of the main chip region in a second direction perpendicular to the first direction.

11. A semiconductor device comprising:
a semiconductor substrate including a plurality of main chip regions and a scribe lane region surrounding the main chip regions, the scribe lane region including a first region and a second region different from the first region;
a plurality of dam structures at edges of the main chip regions on the scribe lane region;
a passivation layer on the main chip regions, the passivation layer including a plurality of bridge patterns on the plurality of dam structures, the plurality of bridge patterns covering the first region of the scribe lane region such that the second region of the scribe lane region is exposed;
a plurality of bump pads exposed by the passivation layer on the main chip regions;
a seed layer on the plurality of bump pads; and
bumps on the seed layer.

12. The semiconductor device of claim 11, wherein the plurality of bridge patterns connect adjacent ones of the main chip regions.

13. The semiconductor device of claim 11, wherein
the first region of the scribe lane region surrounds the main chip region and the second region surrounds the first region; and
the plurality of dam structures are in the first region.

14. The semiconductor device of claim 11, wherein an area occupied by the second region of the scribe lane region is larger than an area occupied by the plurality of bridge patterns.

15. A semiconductor device comprising:
a semiconductor substrate including a plurality of main chip regions and a scribe lane region surrounding the main chip regions;
a plurality of dam structures on a portion of the scribe lane region, and being adjacent to edges of the main chip regions, the plurality of dam structures including a conductive material, the plurality of dam structures extending in a first direction; and
a plurality of bridge patterns connecting the main chip regions to the scribe lane region, the plurality of bridge patterns on the plurality of dam structure, the plurality of bridge patterns extending across portions of the plurality of dam structures in a second direction, the second direction different from the first direction.

16. The semiconductor device of claim 15, further comprising:
a main chip protecting layer covering the main chip regions;
a plurality of bump pads exposed by the main chip protecting layer on the main chip region;
a seed layer on the plurality of bump pads; and
a plurality of bumps on the seed layer.

17. The semiconductor device of claim 16, wherein
the main chip protecting layer and the plurality of bridge patterns constitute a passivation layer; and
the passivation layer includes photosensitive polyimide.

18. The semiconductor device of claim 15, wherein the plurality of bridge patterns connect adjacent ones of the main chip regions.

19. The semiconductor device of claim 15, wherein
the scribe lane region includes a first region and a second region;
the first region is covered by the plurality of bridge patterns; and
an area occupied by the second region is larger than an area occupied by the plurality of bridge patterns.

* * * * *